(12) United States Patent
Kim et al.

(10) Patent No.: US 11,489,144 B2
(45) Date of Patent: Nov. 1, 2022

(54) DISPLAY DEVICE

(71) Applicant: Samsung Display Co., Ltd., Yongin-Si (KR)

(72) Inventors: Sangjae Kim, Yongin-si (KR); SeungHwa Ha, Hwaseong-si (KR); Seung-Ho Jung, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 162 days.

(21) Appl. No.: 16/748,058

(22) Filed: Jan. 21, 2020

(65) Prior Publication Data

US 2020/0259124 A1    Aug. 13, 2020

(30) Foreign Application Priority Data

Feb. 11, 2019    (KR) .................. 10-2019-0015478

(51) Int. Cl.
*H01L 51/52* (2006.01)
*G02B 5/30* (2006.01)
*G02B 1/111* (2015.01)

(52) U.S. Cl.
CPC .......... *H01L 51/5281* (2013.01); *G02B 1/111* (2013.01); *G02B 5/3083* (2013.01); *H01L 51/5246* (2013.01); *H01L 2251/5338* (2013.01)

(58) Field of Classification Search
CPC ................................................... H01L 51/5281
See application file for complete search history.

(56) References Cited

U.S. PATENT DOCUMENTS

| | | |
|---|---|---|
| 9,720,281 B2 | 8/2017 | Tsunekawa |
| 9,798,189 B2 | 10/2017 | Murata et al. |
| 9,995,863 B2 | 6/2018 | Shin et al. |
| 10,054,816 B2 | 8/2018 | Koike et al. |
| 2015/0369981 A1* | 12/2015 | Takeda ................. G02B 5/3025 359/488.01 |
| 2021/0311342 A1* | 10/2021 | Lim ..................... G02F 1/1396 |

* cited by examiner

*Primary Examiner* — Fernando L Toledo
*Assistant Examiner* — Valerie N Newton
(74) *Attorney, Agent, or Firm* — Cantor Colburn LLP

(57) ABSTRACT

A display device includes a display panel which displays an image, an anti-reflection film disposed on a display surface of the display panel, and a plurality of retardation films disposed on the anti-reflection film. Each of the plurality of retardation films has an in-plane retardation of about 1000 nanometers to about 7000 nanometers.

12 Claims, 19 Drawing Sheets

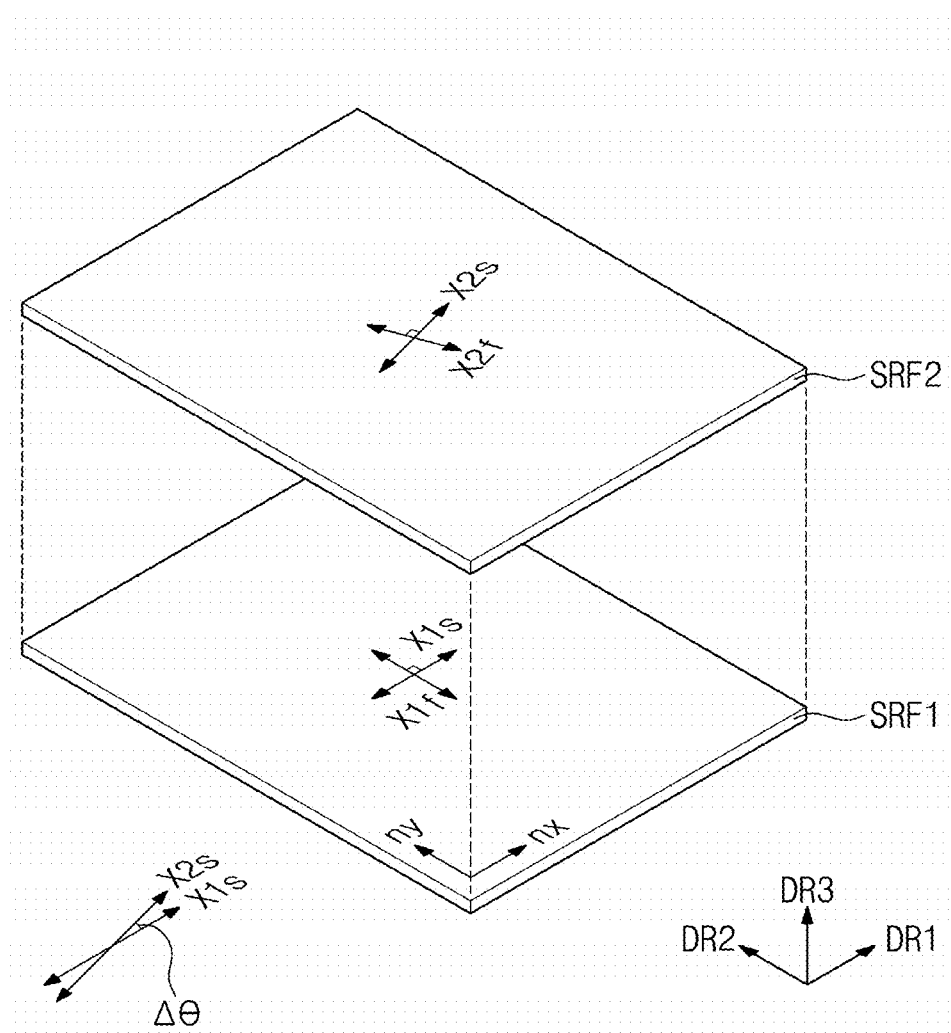

No film

With film

DISPLAY DEVICE

This application claims priority under 35 U.S.C. § 119 of Korean Patent Application No. 10-2019-0015478 filed on Feb. 11, 2019, and all the benefits accruing therefrom under 35 U.S.C. § 119, the content of which in its entirety is herein incorporated by reference.

BACKGROUND

1. Field

Exemplary embodiments of the invention herein relate to a display device, and more particularly, to a display device with improved product reliability.

2. Description of Related Art

Electronic devices such as smart phones, tablets, notebook computers, and smart televisions have been developed. These electronic devices include display modules for providing information. The electronic devices further include various electronic modules in addition to the display modules.

Recently, foldable or rollable display devices including flexible display members have been developed. Unlike a flat display device, flexible display devices may be foldable, rollable or bendable like a piece of paper. The flexible display devices having variously changeable shapes may be easily portable and may improve convenience of users.

SUMMARY

Exemplary embodiments of the invention may provide a display device capable of improving visibility of a user wearing sunglasses.

In an exemplary embodiment of the invention, a display device includes a display panel which displays an image, an anti-reflection film disposed on a display surface of the display panel, and a plurality of retardation films disposed on the anti-reflection film. Each of the plurality of retardation films has an in-plane retardation of about 1000 nanometers (nm) to about 7000 nm.

In an exemplary embodiment, the plurality of retardation films may include a first retardation film disposed on the anti-reflection film, and a second retardation film disposed on the first retardation film.

In an exemplary embodiment, an angle difference between a first slow axis of the first retardation film and a second slow axis of the second retardation film may be equal to or greater than about 0 degree and less than about 30 degrees.

In an exemplary embodiment, the display device may further include an adhesive film disposed between the first and second retardation films to couple the first and second retardation films to each other.

In an exemplary embodiment, the first and second retardation films may have the same in-plane retardation with each other.

In an exemplary embodiment, the first and second retardation films may have the same thickness with each other.

In an exemplary embodiment, each of the plurality of retardation films may include a transparent material having optical anisotropy.

In an exemplary embodiment, each of the plurality of retardation films may include one kind of a resin including at least one of a polyester-based resin, a polyolefin-based resin, an acrylic-based resin, a polyurethane-based resin, a polyethersulfone-based resin, a polycarbonate-based resin, a polysulfone-based resin, and a polyether-based resin.

In an exemplary embodiment, the anti-reflection film may include a polarizing film and a λ/4 retardation film disposed between the polarizing film and the display panel.

In an exemplary embodiment, the display panel may include an organic light emitting display panel including an organic light emitting element.

In an exemplary embodiment, the display device may further include a window disposed on the display panel.

In an exemplary embodiment, each of the plurality of retardation films may be disposed between the window and the display panel.

In an exemplary embodiment, a first retardation film of the plurality of retardation films may be disposed between the window and the display panel, and a second retardation film of the plurality of retardation films may be disposed on the window.

In an exemplary embodiment of the invention, a display device includes a display panel which displays an image and including a folding area foldable with reference to an imaginary folding axis and a plurality of non-folding areas adjacent to both sides of the folding area in a plan view, a λ/4 retardation film disposed on a display surface of the display panel, a polarizing film disposed on the λ/4 retardation film, a first retardation film disposed on the polarizing film, and a second retardation film disposed on the first retardation film. An angle difference between a first slow axis of the first retardation film and a second slow axis of the second retardation film is equal to or greater than about 0 degree and less than about 30 degrees.

In an exemplary embodiment, each of the first and second retardation films may have an in-plane retardation of about 1000 nm to about 7000 nm.

In an exemplary embodiment, each of the first and second retardation films may have a thickness of about 20 micrometers (μm) to about 50 μm.

In an exemplary embodiment, the display device may further include a window disposed on the display panel, and each of the first and second retardation films may be disposed between the window and the display panel.

In an exemplary embodiment, the display device may further include an adhesive film which is disposed between the first and second retardation films and couples the first and second retardation films to each other.

In an exemplary embodiment, the display device may further include a window disposed on the display panel, the first retardation film may be disposed between the window and the display panel, and the second retardation film may be disposed on the window.

In an exemplary embodiment, the display device may further include a first adhesive film which is disposed between the first retardation film and the window and fixes the first retardation film to a bottom surface of the window, and a second adhesive film which is disposed between the second retardation film and the window and fixes the second retardation film to a top surface of the window.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIG. 3 is an exploded perspective view illustrating first and second retardation films of FIG. 2;

DETAILED DESCRIPTION

Figure 1:
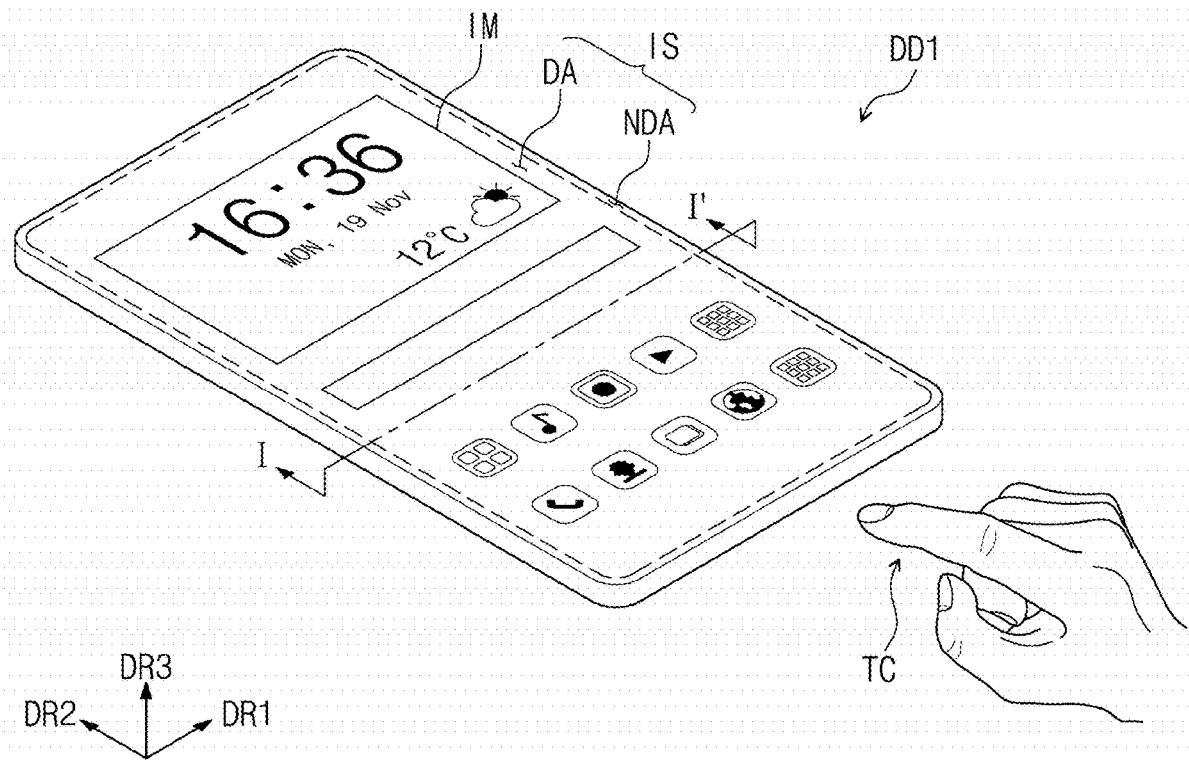
FIG. 1 is a perspective view illustrating an exemplary embodiment of a display device according to the invention.

The invention now will be described more fully hereinafter with reference to the accompanying drawings, in which various embodiments are shown. The invention may, however, be embodied in many different forms, and should not be construed as limited to the exemplary embodiments set forth herein. Rather, these embodiments are provided so that this invention will be thorough and complete, and will fully convey the scopes of the invention to those skilled in the art. Like reference numerals refer to like elements throughout. It will be understood that when an element such as a layer, region or substrate is referred to as being "on" another element, it may be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the drawing figures are schematic in nature and their shapes are not intended to illustrate the actual shape of a region of a device and are not intended to limit the scope of exemplary embodiments.

Hereinafter, exemplary embodiments of the invention will be described in detail with reference to the accompanying drawings.

Figure 2:
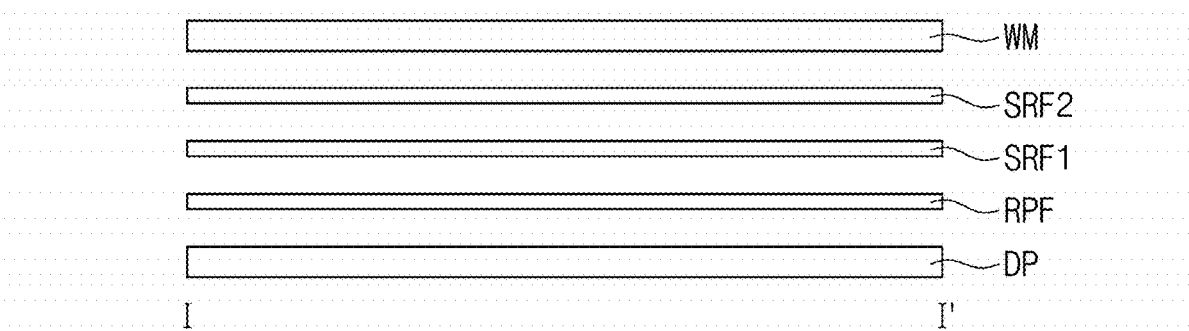
FIG. 2 is an exploded cross-sectional view taken along line I-I' of FIG. 1.

FIG. 1 is a perspective view illustrating an exemplary embodiment of a display device according to the invention, and FIG. 2 is an exploded cross-sectional view taken along line I-I' of FIG. 1.

Referring to FIG. 1, a display area DA and a non-display area NDA may be defined in a display device DD1.

The display area DA on which an image IM is displayed may be parallel to a plane defined by a first directional axis DR1 and a second directional axis DR2. A normal direction of the display area DA (i.e., a thickness direction of the display device DD1) may be indicated by a third directional axis DR3. A front surface (or a top surface) and a rear surface (or a bottom surface) of each of members may be defined by the third directional axis DR3. However, directions indicated by the first to third directional axes DR1, DR2 and DR3 may be relative concepts and may be changed into other directions. Hereinafter, first to third directions are the directions indicated by the first to third directional axes DR1, DR2 and DR3, respectively, and are indicated by the same reference designators as the first to third directional axes DR1, DR2 and DR3.

The display device DD1 may be used in large-sized electronic devices (e.g., televisions, monitors, and external billboards) and small and middle-sized electronic devices (e.g., personal computers, notebook computers, personal digital assistants ("PDAs"), car navigation units, game consoles, portable electronic devices, and cameras). However, these are provided only as embodiments of the invention. In certain embodiments, the display device DD1 may be used in other various electronic devices without departing from the spirits and scopes of the invention.

The non-display area NDA may be adjacent to the display area DA and may be an area in which the image IM is not displayed. A bezel area of the display device DD1 may be defined by the non-display area NDA.

The non-display area NDA may surround the display area DA in a plan view. However, this is provided only as an example. In certain embodiments, the non-display area NDA may be adjacent to only a portion of an edge of the display area DA or may be omitted. However, the invention is not limited thereto.

Referring to FIGS. 1 and 2, the display device DD1 may include a display panel DP and a window WM. The display panel DP may be a flexible display panel. In other words, the display panel DP may be flexible, and thus a shape of the display panel DP may be changeable by a bending, folding or rolling operation. In an exemplary embodiment, the display panel DP may be an organic light emitting display panel including an organic light emitting element, for example.

The display device DD1 may further include at least one functional layer provided on the display panel DP and at least one protective layer for protecting the display panel DP. The functional layer may be an input sensing layer for sensing an input TC (e.g., a touch operation) of a user. The protective layer may absorb an impact applied from the outside to protect the display panel DP from the impact. The protective layers may be provided on and under the display panel DP, respectively, or the protective layer may be provided on or under the display panel DP.

The window WM may be provided on the display panel DP to define a display surface IS of the display device DD1, on which the image IM is displayed. The window WM may be optically transparent. Thus, the image IM generated from the display panel DP may pass through the window WM so as to be recognized by a user.

The window WM may have a flat shape in the display area DA.

However, the invention is not limited thereto. In certain embodiments, the shape of the window WM may be variously modified. In an exemplary embodiment, edges of the window WM may provide curved surfaces, for example.

The window WM may include a base layer and a window functional layer disposed on the base layer. The base layer may include a plastic material or a thin glass material. The base layer may have a single-layered or multi-layered structure. The window WM may have flexibility, and thus the shape of the window WM may also be changed or deformed when the shape of the display panel DP is changed or deformed.

The window functional layer may include an impact absorbing layer provided on and/or under the base layer to protect the base layer, and a hard coating layer having an indentation hardness higher than that of the base layer. In addition, the window functional layer may further include an anti-fingerprint layer.

The window WM may transmit the image provided from the display panel DP and may reduce or mitigate an external impact to prevent the display panel DP from being broken or malfunctioning by the external impact. The external impact may mean external force (e.g., pressure or stress) which causes a defect in the display panel DP.

The window WM may reduce bending deformation, compressive deformation and/or tensile deformation of the display panel DP caused by the external impact, thereby preventing a defect of the display panel DP by the external impact.

In an exemplary embodiment of the invention, the display device DD1 may further include an anti-reflection film RPF and a plurality of retardation films SRF1 and SRF2, which are provided between the display panel DP and the window WM. The anti-reflection film RPF may be provided on the display panel DP to reduce a reflectance of natural light (or the light of the sun) incident through the window WM. The anti-reflection film RPF in an exemplary embodiment of the invention may include a retarder and a polarizer. The retarder may be a film type or a liquid crystal coating type and may include a λ/2 retarder and/or a λ/4 retarder. The polarizer may also be a film type or a liquid crystal coating type. The film type may include an extendable synthetic resin film, and the liquid crystal coating type may include arranged liquid crystals. When the anti-reflection film RPF includes the polarizer, linearly polarized light may exit from the anti-reflection film RPF.

The plurality of retardation films SRF1 and SRF2 may be provided on the anti-reflection film RPF. The plurality of retardation films SRF1 and SRF2 may be sequentially stacked in the third direction DR3. Each of the plurality of retardation films SRF1 and SRF2 may change linear polarization of light exiting from the anti-reflection film RPF. In other words, light transmitted through each of the plurality of retardation films SRF1 and SRF2 may be unpolarized light.

Thus, the display device DD1 including the plurality of retardation films SRF1 and SRF2 may output the unpolarized light to improve visibility of a user wearing polarized sunglasses. When the display device DD1 outputs linearly polarized light and a user wearing the polarized sunglasses views an image of the display device DD1, the user may not view the image at a specific angle. However, the display device DD1 may include the plurality of retardation films SRF1 and SRF2 to change the linearly polarized light into the unpolarized light, and thus the visibility of a user wearing the polarized sunglasses may be improved.

Each of the plurality of retardation films SRF1 and SRF2 may have optical anisotropy for changing the linear polarization of light exiting from the anti-reflection film RPF. In addition, each of the plurality of retardation films SRF1 and SRF2 may have a high in-plane retardation, for example, an in-plane retardation of about 1000 nanometers (nm) to about 7000 nm, for example. In an exemplary embodiment of the invention, the plurality of retardation films SRF1 and SRF2 may include a first retardation film SRF1 and a second retardation film SRF2. However, the number of the retardation films is not limited thereto.

FIG. 3 is an exploded perspective view illustrating first and second retardation films of FIG. 2. FIGS. 4A to 4D are images showing simulation results that a display device displaying a white color is viewed by a user wearing polarized sunglasses, according to an angle difference Δθ between first and second slow axes X1s and X2s.

Referring to FIG. 3, each of the first and second retardation films SRF1 and SRF2 may have a plate shape in a plane defined by the first and second directions DR1 and DR2. A thickness of each of the first and second retardation films SRF1 and SRF2 may be defined as a thickness in the third direction DR3.

In an exemplary embodiment, each of the first and second retardation films SRF1 and SRF2 may have the in-plane retardation of about 1000 nm to about 7000 nm, for example. Here, the in-plane retardation may be defined as a retardation in a plane defined by the first and second directions DR1 and DR2.

The in-plane retardation Re may be expressed by the following equation:

$$Re = \Delta n \times d$$

Here, 'Δn' denotes a difference between '$n_x$' and '$n_y$', and denotes the thickness of each of the retardation films. In addition, '$n_x$' denotes a refractive index (hereinafter, referred to as a first refractive index) in a direction (i.e., a slow axis direction) in which a refractive index is greatest in each of the first and second retardation films SRF1 and SRF2, and '$n_y$' denotes a refractive index (hereinafter, referred to as a second refractive index) in a direction (i.e., a fast axis direction) perpendicular to the slow axis. The in-plane retardation Re may increase as the difference between the first and second refractive indexes increases, and the in-plane retardation Re may increase as the thickness d of each of the first and second retardation films SRF1 and SRF2 increases.

In an exemplary embodiment, the first and second retardation films SRF1 and SRF2 may have the same in-plane retardation in an in-plane retardation range from about 1000 nm to about 7000 nm, for example. In another exemplary embodiment of the invention, the first and second retardation films SRF1 and SRF2 may have different in-plane retardations in the in-plane retardation range from about 1000 nm to about 7000 nm, for example.

In an exemplary embodiment, each of the first and second retardation films SRF1 and SRF2 may have a thickness of about 20 micrometers (μm) to about 50 μm. The first and second retardation films SRF1 and SRF2 may have the same thickness in a thickness range from about 20 μm to about 50 μm. In another exemplary embodiment of the invention, the first and second retardation films SRF1 and SRF2 may have different thicknesses in the thickness range from about 20 μm to about 50 μm, for example. In particular, in the event that the in-plane retardations of the first and second retardation films SRF1 and SRF2 are different from each other, the first and second retardation films SRF1 and SRF2 may have different thicknesses from each other.

Each of the first and second retardation films SRF1 and SRF2 may include a transparent material having the optical anisotropy. In an exemplary embodiment, each of the first and second retardation films SRF1 and SRF2 may include one kind of a resin including at least one of a polyester-based resin, a polyolefin-based resin, an acrylic-based resin, a polyurethane-based resin, a polyethersulfone-based resin, a polycarbonate-based resin, a polysulfone-based resin, and a polyether-based resin, for example. In an exemplary embodiment, each of the first and second retardation films SRF1 and SRF2 may include polyethylene terephthalate ("PET") or polyethylene naphthalate ("PEN"), for example.

A base layer including PET may be stretched at a glass transition temperature or more and then may be thermally treated to obtain each of the first and second retardation films SRF1 and SRF2.

An axis of a direction in which the first retardation film SRF1 has the greatest in-plane refractive index may be defined as a first slow axis X1s, and an axis of a direction perpendicular to the first slow axis X1s may be defined as a first fast axis X1f. An axis of a direction in which the second retardation film SRF2 has the greatest in-plane refractive index may be defined as a second slow axis X2s, and an axis of a direction perpendicular to the second slow axis X2s may be defined as a second fast axis X2f. In an exemplary embodiment, the first slow axis X1s and the second slow axis X2s may be parallel to each other. In other words, the first slow axis X1s and the second slow axis X2s may have an angle difference Δθ of 0 degree therebetween. However, the first and second slow axes X1s and X2s may not be parallel to each other, due to a deviation of the stretching process. In another exemplary embodiment, when the first and second slow axes X1s and X2s are not parallel to each other, the angle difference Δθ between the first and second slow axes X1s and X2s may be greater than about 0 degree and less than about 30 degrees.

Figure 4A:
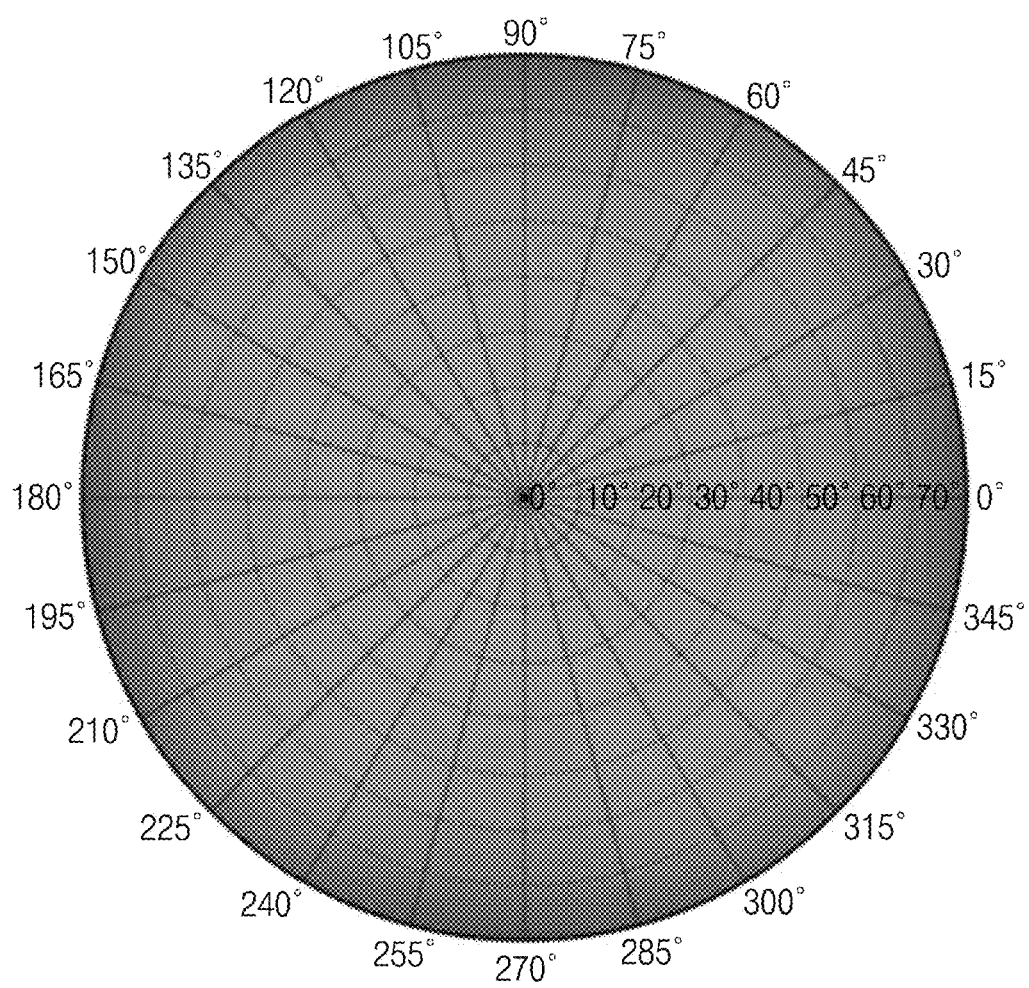
FIGS. 4A to 4D are images showing simulation results that a display device displaying a white color is viewed by a user wearing polarized sunglasses, according to an angle difference between first and second slow axes.
Figure 4B:
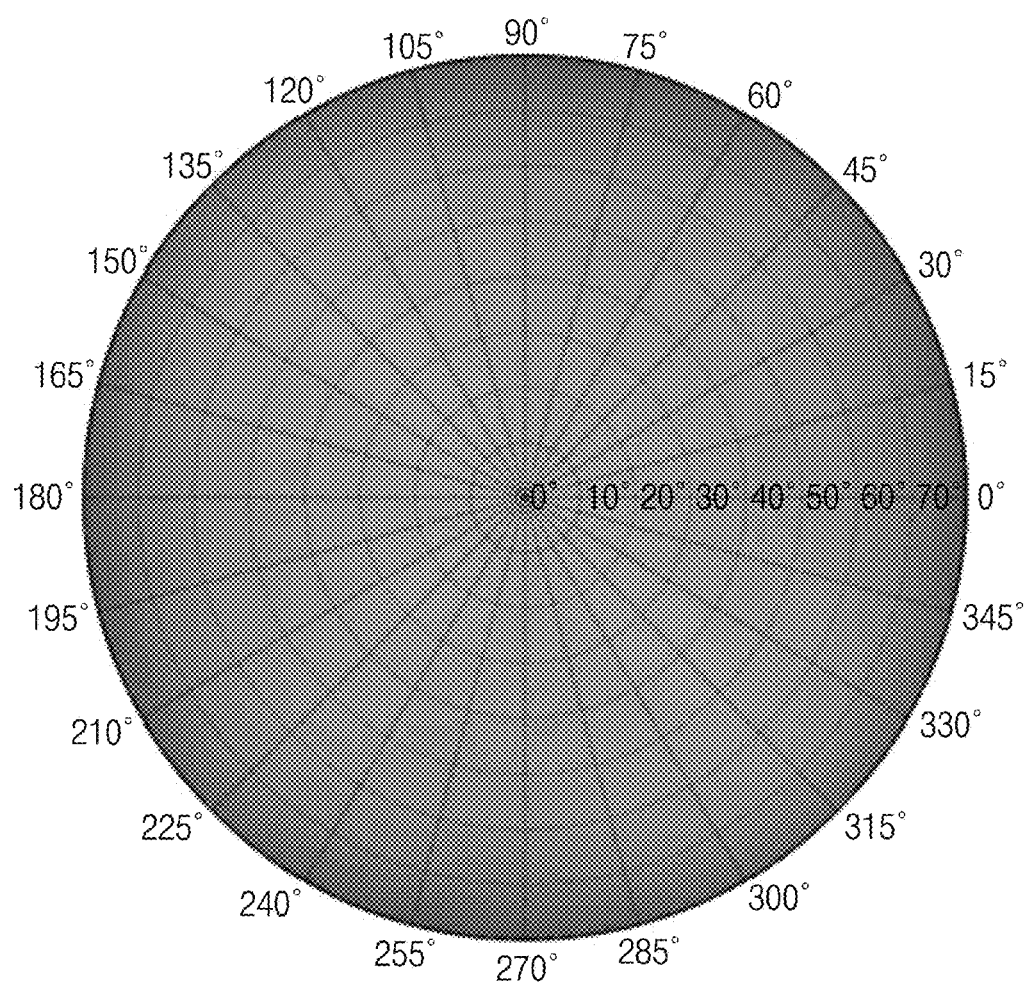

FIGS. 4A and 4B show simulation results when the in-plane retardation of each of the first and second retardation films SRF1 and SRF2 is 4500 nm and the angle differences Δθ between the first and second slow axes X1s and X2s are 0 degree and 10 degrees, respectively. When the angle differences Δθ between the first and second slow axes X1s and X2s are 0 degree and 10 degrees, a user wearing the polarized sunglasses may view a normal color. In particular, the user wearing the polarized sunglasses may view the normal color regardless of a viewing angle.

Figure 4C:
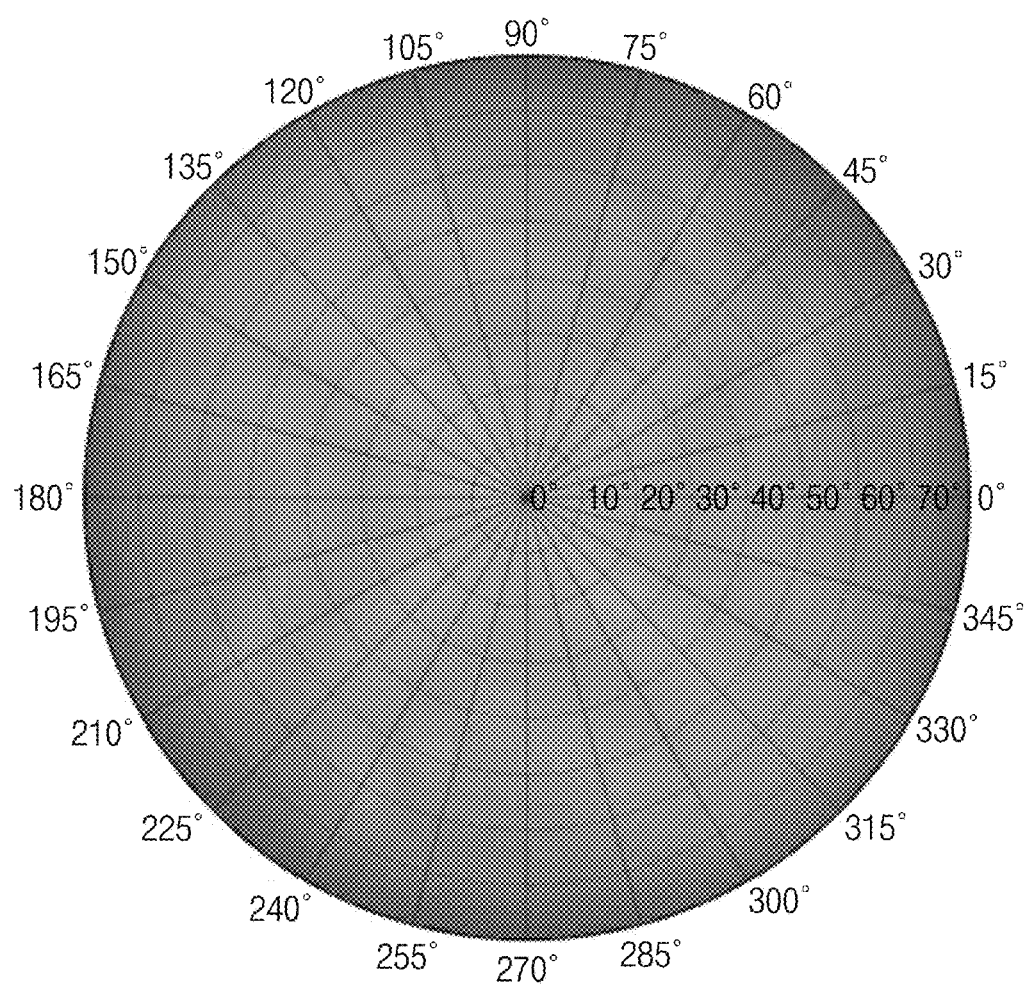

Referring to FIG. 4C, when the in-plane retardation of each of the first and second retardation films SRF1 and SRF2 is 4500 nm and the angle difference Δθ between the first and second slow axes X1s and X2s is 20 degrees, a user wearing the polarized sunglasses may view a normal color in front. However, when the user views the display device DD1 from left and right sides, distortion of a color occurs slightly. However, the degree of the distortion of the color may be negligible.

Figure 4D:
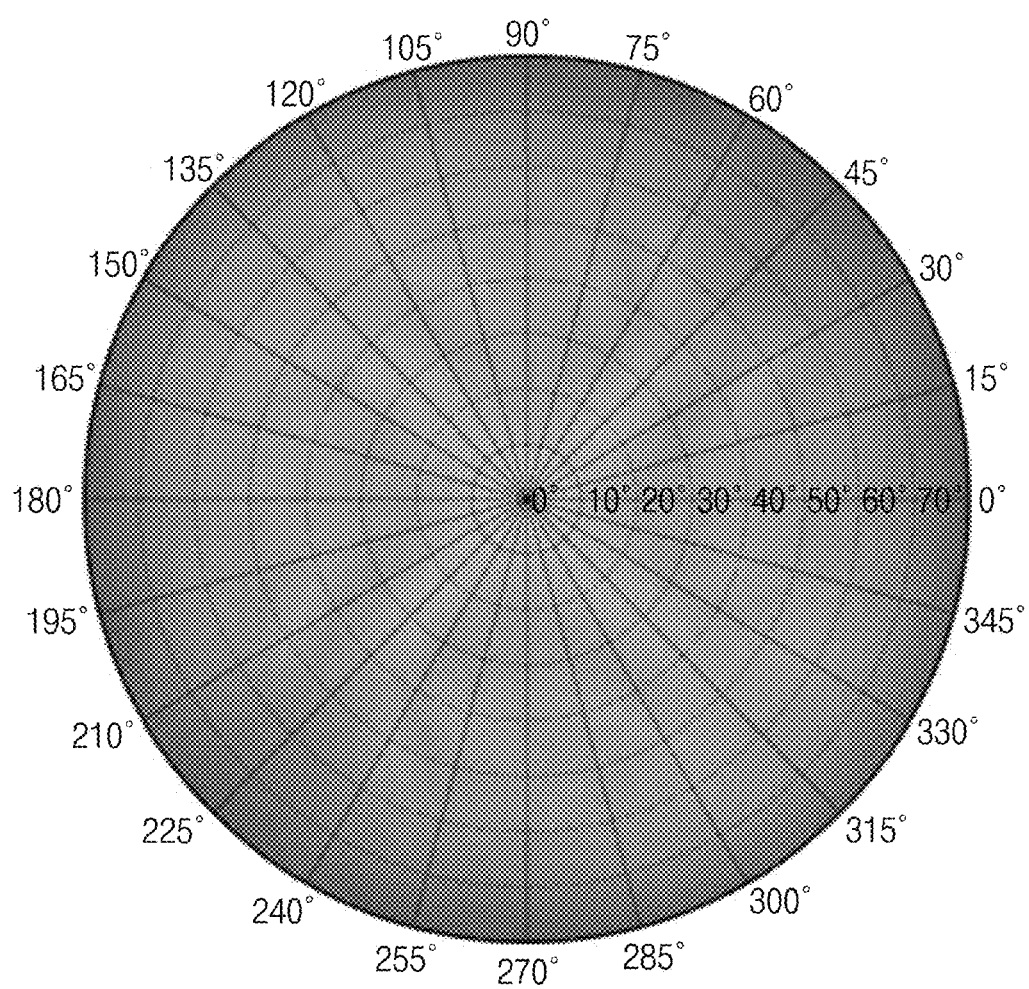

Referring to FIG. 4D, when the in-plane retardation of each of the first and second retardation films SRF1 and SRF2 is 4500 nm and the angle difference Δθ between the first and second slow axes X1s and X2s is 30 degrees, a user wearing the polarized sunglasses may view a normal color in front. However, when the user views the display device DD1 from left and right sides, distortion of a color occurs. The degree of the distortion of the color of the exemplary embodiment in FIG. 4D may be greater than the degree of the distortion of the color of the exemplary embodiment in FIG. 4C.

As described above, the degree of the distortion of the color may increase as the angle difference Δθ between the first and second slow axes X1s and X2s increases. A magnitude of the in-plane retardation of each of the first and second retardation films SRF1 and SRF2 may be adjusted depending on the angle difference Δθ between the first slow axis X1s of the first retardation film SRF1 and the second slow axis X2s of the second retardation film SRF2. In other words, when the angle difference Δθ is great, the in-plane retardation of each of the first and second retardation films SRF1 and SRF2 may be increased.

Figure 5:
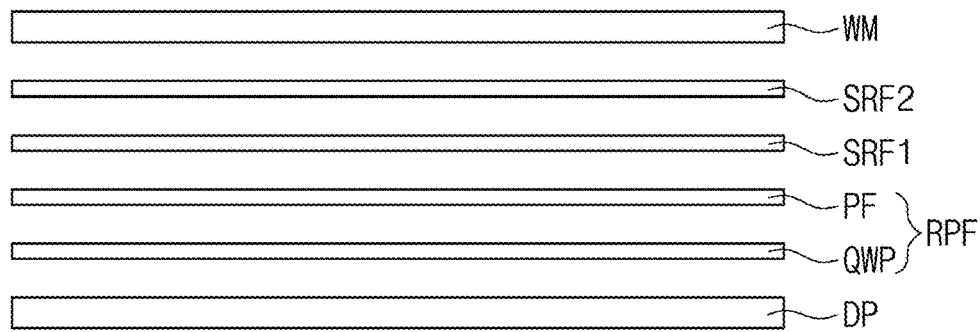
FIG. 5 is an exploded cross-sectional view illustrating another exemplary embodiment of a display device according to the invention.
Figure 6:
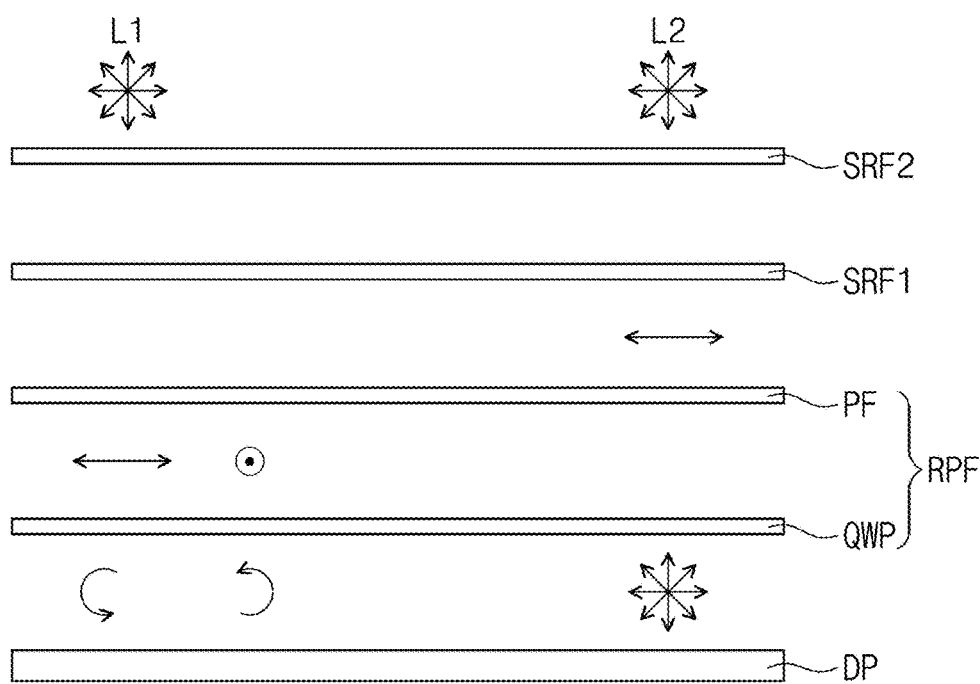
FIG. 6 is a cross-sectional view illustrating functions of first and second retardation films of FIG. 5.
Figure 7A:
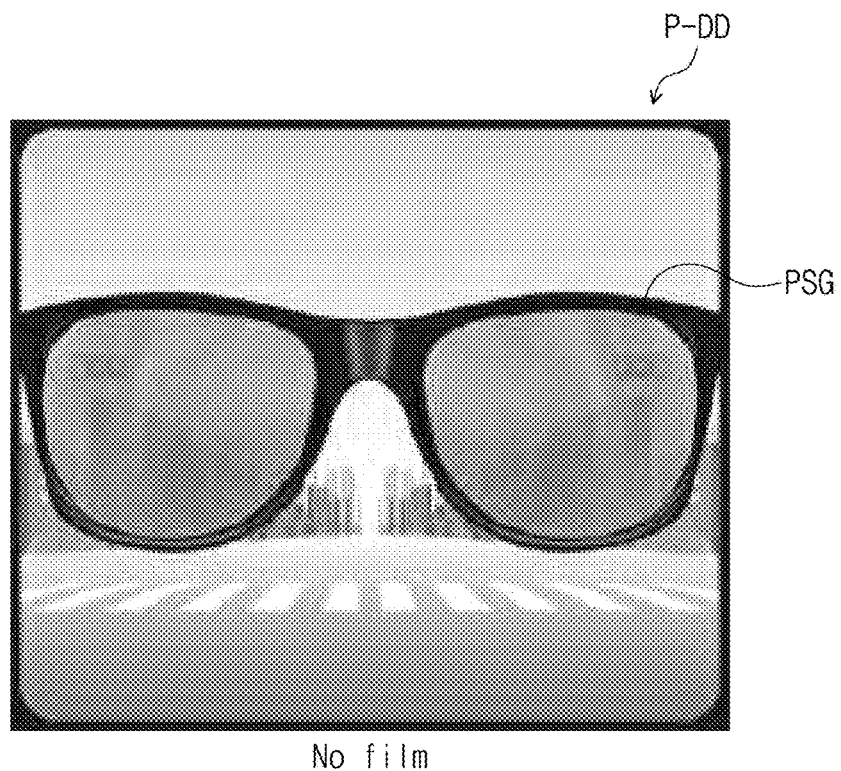
FIGS. 7A and 7B are images showing visibility difference according to whether first and second retardation films exist or not.
Figure 7B:
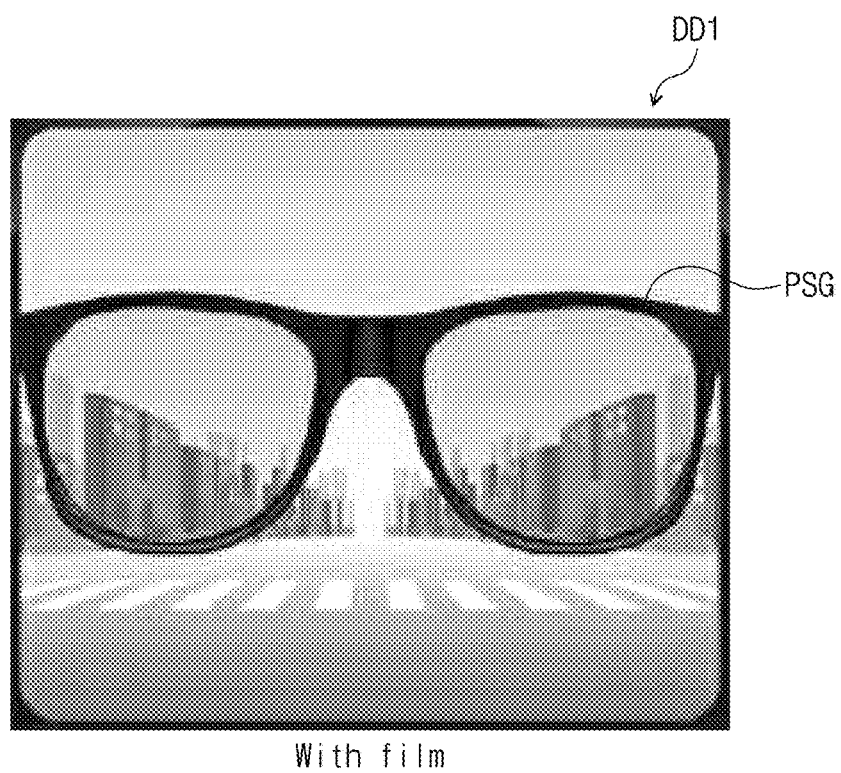
Figure 8A:
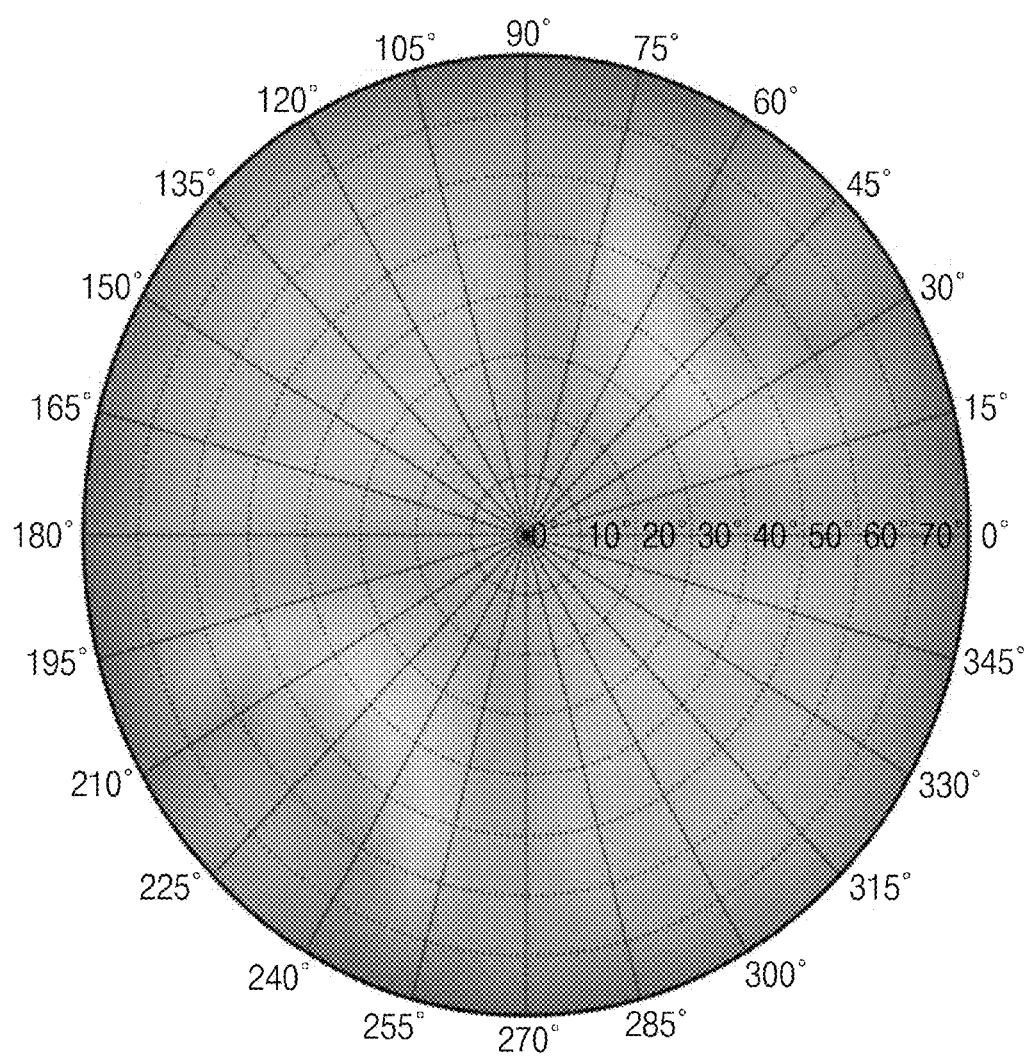
FIGS. 8A to 8C are images showing simulation results that a display device displaying a white color is viewed by a user wearing polarized sunglasses, according to a sum of in-plane retardations of first and second retardation films.
Figure 8B:
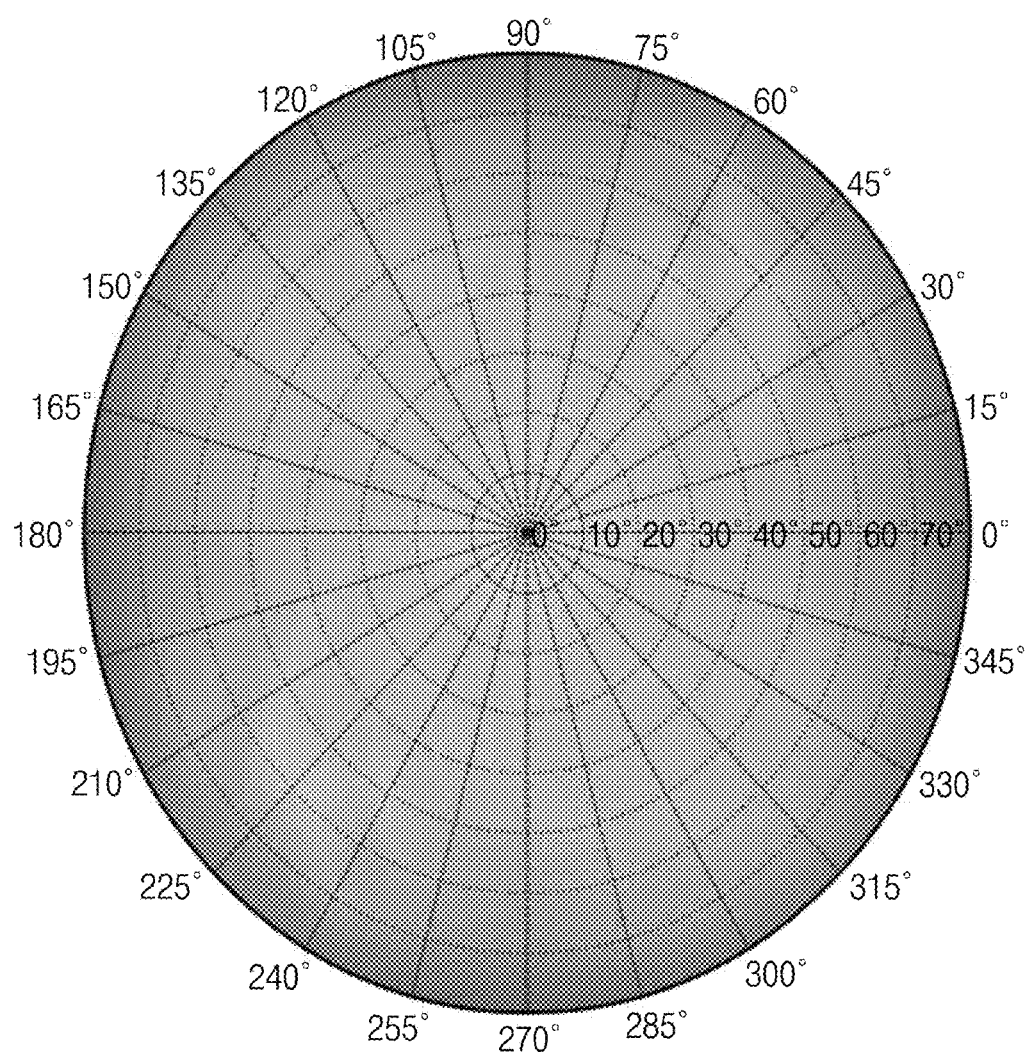
Figure 8C:
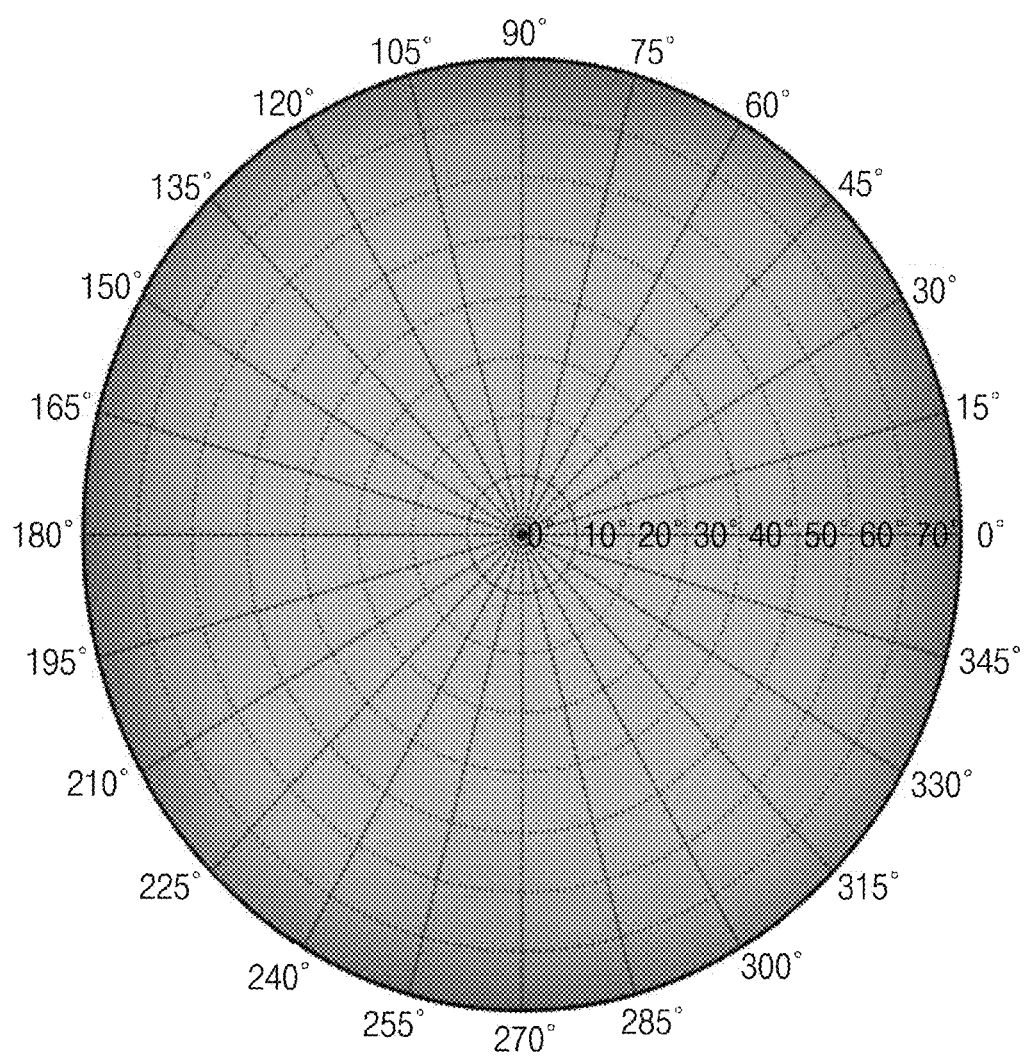

FIG. 5 is an exploded cross-sectional view illustrating another exemplary embodiment of a display device according to the invention, and FIG. 6 is a cross-sectional view illustrating functions of first and second retardation films of FIG. 5. FIGS. 7A and 7B are images showing visibility difference according to whether first and second retardation films exist or not. FIGS. 8A to 8C are images showing simulation results that a display device displaying a white color is viewed by a user wearing polarized sunglasses, according to a sum of in-plane retardations of first and second retardation films.

Referring to FIG. 5, in a display device in another exemplary embodiment of the invention, an anti-reflection film RPF may include a polarizing film PF and a λ/4 retardation film QWP.

The polarizing film PF may perform a polarization function for transmitting light having a specific vibration direction. The polarizing film PF may have a polarization axis, may transmit a component of light which coincides with the polarization axis, and may absorb a component of light which does not coincide with the polarization axis. The polarizing film PF may be disposed between the display panel DP and the first retardation film SRF1. In an exemplary embodiment, the polarizing film PF may include poly vinyl alcohol ("PVA"), for example.

The λ/4 retardation film QWP may include a layer having refractive index anisotropy. The λ/4 retardation film QWP may consist of the refractive index anisotropy layer or may include a resin film and the refractive index anisotropy layer disposed on the resin film.

The λ/4 retardation film QWP may have an optical axis rotated by 214 (±45 degrees) from the polarization axis of the polarizing film PF. Thus, the λ/4 retardation film QWP may circularly polarize incident light such that the vibration direction of the incident light rotates. The λ/4 retardation film QWP may be provided between the polarizing film PF and the display panel DP.

The polarizing film PF and the λ/4 retardation film QWP may be coupled to each other to constitute the anti-reflection film RPF.

As illustrated in FIG. 6, when natural light L1 is incident to the display device, the natural light L1 may pass through the first and second retardation films SRF1 and SRF2 and then may be incident to the polarizing film PF. The natural light L1 may be linearly polarized by the polarizing film PF. When the polarizing film PF has the polarization axis parallel to the first direction DR1 (refer to FIGS. 1 and 2), the natural light L1 may be linearly polarized and outputted as light having a component parallel to the first direction DR1 (hereinafter, referred to as a first linearly polarized component). The first linearly polarized component of the natural light L1 may be circularly polarized through the λ/4 retardation film QWP. In an exemplary embodiment, the λ/4 retardation film QWP may left-circularly polarize the first linearly polarized component, for example. In other words, the first linearly polarized component may be changed into a circularly polarized component (hereinafter, referred to as a first circularly polarized component) by the λ/4 retardation film QWP.

The first circularly polarized component may be reflected by the display panel DP, and thus a rotation direction of the first circularly polarized component may be reversed. In other words, when the first circularly polarized component is a left-circularly polarized component, the first circularly polarized component may be changed into a right-circularly polarized component. On the contrary, when the first circularly polarized component is the right-circularly polarized component, the first circularly polarized component may be changed into the left-circularly polarized component.

The circularly polarized component (hereinafter, referred to as a second circularly polarized component) reflected by the display panel DP may be linearly polarized while passing through the λ/4 retardation film QWP. The light linearly polarized by the λ/4 retardation film QWP is defined as a second linearly polarized component. The second linearly polarized component may form an angle of 90 degrees with the polarization axis of the polarizing film PF. Thus, the second linearly polarized component may not pass through the polarizing film PF but may be blocked by the polarizing film PF. As a result, the natural light L1 reflected by the display panel DP may not pass through the polarizing film PF but may be removed.

The anti-reflection film RPF preventing the reflection of the natural light L1 as described above may linearly polarize internal light L2 exiting from the display panel DP. When the polarized internal light L2 is incident directly to the polarized sunglasses of a user, a portion of an image may not pass through the polarized sunglasses in accordance with an angle of the polarized sunglasses. When the polarized internal light L2 coincides with an absorption axis of the polarized sunglasses at a specific angle, a user wearing the polarized sunglasses may not view an image outputted from the display device.

However, the display device DD1 in the exemplary embodiments of the invention may include the first and second retardation films SRF1 and SRF2 on the anti-reflection film RPF, and thus the polarized internal light L2 may not be incident directly to the polarized sunglasses of a user. The internal light L2 polarized by the polarizing film PF may be confused when passing through the first and second retardation films SRF1 and SRF2. The first and second retardation films SRF1 and SRF2 may convert the linearly polarized internal light L2 into light close or similar to the natural light L1. In other words, the first and second retardation films SRF1 and SRF2 may approximate the spectrum of light transmitted therethrough to the spectrum of light exiting from the display panel DP.

Referring to FIG. 7A, when a user wearing polarized sunglasses PSG views a display device P-DD having a structure (i.e., no film structure) not including the first and second retardation films SRF1 and SRF2 on the anti-reflection film RPF, an image outputted from the display device P-DD may not pass through the polarized sunglasses PSG at a specific angle. In this case, the user wearing the polarized sunglasses PSG may view a cloudy image or may not view an image.

However, as illustrated in FIG. 7B, when a user views the display device DD1 having the structure (i.e., structure with film) including the first and second retardation films SRF1 and SRF2 on the anti-reflection film RPF, the user may normally view an image outputted from the display device DD1 even when wearing the polarized sunglasses PSG. Thus, visibility of an image outputted from the display device DD1 may be improved.

In FIG. 8A, each of the first and second retardation films SRF1 and SRF2 may have an in-plane retardation of 1050 nm, and a sum of the in-plane retardations of the first and second retardation films SRF1 and SRF2 may be 2100 nm.

In FIG. 8B, each of the first and second retardation films SRF1 and SRF2 may have an in-plane retardation of 2100 nm, and a sum of the in-plane retardations of the first and second retardation films SRF1 and SRF2 may be 4200 nm. In FIG. 8C, each of the first and second retardation films SRF1 and SRF2 may have an in-plane retardation of 4200 nm, and a sum of the in-plane retardations of the first and second retardation films SRF1 and SRF2 may be 8400 nm. In FIGS. 8A to 8C, the angle difference Δθ between the first and second slow axes X1f and X2f of the first and second retardation films SRF1 and SRF2 may be 0 degree.

As illustrated in FIGS. 8A to 8C, when a user wearing the polarized sunglasses views the display device displaying a white color, the distortion of the color may increase as the sum of the in-plane retardations decreases.

In the exemplary embodiments of the invention, the in-plane retardations of the first and second retardation films SRF1 and SRF2 may be equal to each other or may be different from each other. In an exemplary embodiment, when the sum of the in-plane retardations of the first and second retardation films SRF1 and SRF2 is 4200 nm, each of the first and second retardation films SRF1 and SRF2 may have the in-plane retardation of 2100 nm. In another exemplary embodiment, when the sum of the in-plane retardations of the first and second retardation films SRF1 and SRF2 is 4200 nm, the first and second retardation films SRF1 and SRF2 may have different in-plane retardations (e.g., about 1100 nm and about 3100 nm).

Figure 9:
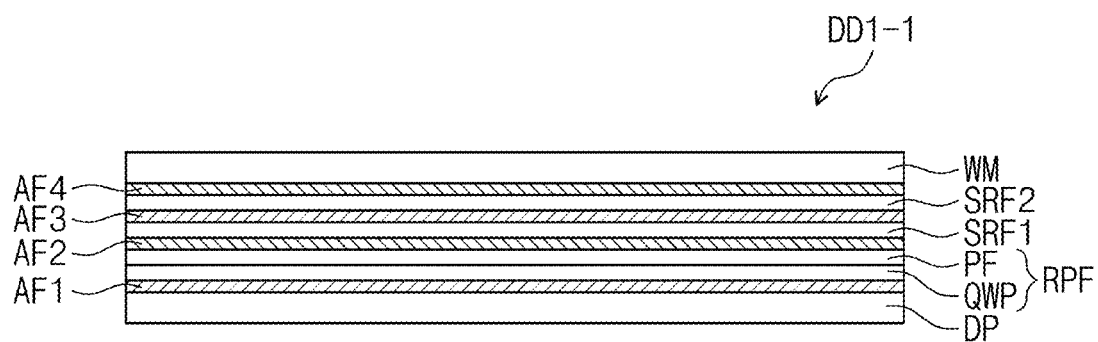
FIG. 9 is a cross-sectional view illustrating an exemplary embodiment of an assembled display device according to the invention.
Figure 10:
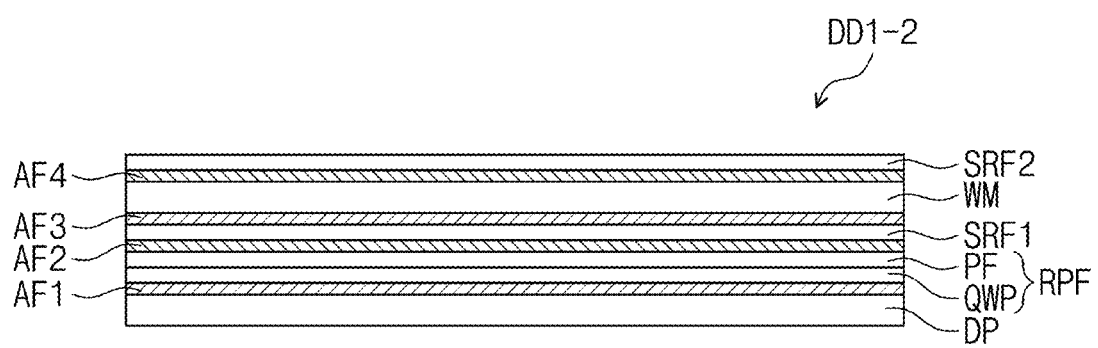
FIG. 10 is a cross-sectional view illustrating another exemplary embodiment of an assembled display device according to the invention.

FIG. 9 is a cross-sectional view illustrating an exemplary embodiment of an assembled display device according to the invention, and FIG. 10 is a cross-sectional view illustrating another exemplary embodiment of an assembled display device according to the invention.

Referring to FIG. 9, a display device DD1-1 in an exemplary embodiment of the invention may include the display panel DP, the anti-reflection film RPF, the plurality of retardation films SRF1 and SRF2, and the window WM. The display device DD1-1 may further include a plurality of adhesive films AF1, AF2, AF3 and AF4 for coupling the display panel DP, the anti-reflection film RPF, the plurality of retardation films SRF1 and SRF2, and the window WM. Here, the plurality of retardation films SRF1 and SRF2 may be the first and second retardation films SRF1 and SRF2.

In an exemplary embodiment, the display device DD1-1 may include a first adhesive film AF1, a second adhesive film AF2, a third adhesive film AF3, and a fourth adhesive film AF4. However, the invention is not limited thereto. In other words, one of the first to fourth adhesive films AF1 to AF4 may be omitted, or one or more adhesive films may be added to the display device DD1-1.

The first adhesive film AF1 may be disposed between the display panel DP and the anti-reflection film RPF to adhere the anti-reflection film RPF to the display panel DP. The anti-reflection film RPF may include the polarizing film PF and the λ/4 retardation film QWP. In particular, the first adhesive film AF1 may be adhered to a top surface of the display panel DP and a bottom surface of the λ/4 retardation film QWP. In FIG. 9, the polarizing film PF and the λ/4 retardation film QWP are stacked without an additional adhesive film therebetween. However, the invention is not limited thereto. In another exemplary embodiment, an additional adhesive film may be provided between the polarizing film PF and the λ/4 retardation film QWP to fix the polarizing film PF and the λ/4 retardation film QWP.

The second adhesive film AF2 may be disposed between the anti-reflection film RPF and the first retardation film SRF1 to fix the first retardation film SRF1 to the anti-reflection film RPF. In particular, the second adhesive film AF2 may be adhered to a top surface of the polarizing film PF and a bottom surface of the first retardation film SRF1.

The first and second retardation films SRF1 and SRF2 may be coupled to each other by the third adhesive film AF3. In the illustrated exemplary embodiment, the plurality of retardation films may include two retardation films. However, the invention is not limited thereto. The number of the adhesive film(s) for coupling the retardation films may be changed depending on the number of the retardation films.

In an exemplary embodiment, each of the first and second retardation films SRF1 and SRF2 may have a thickness of about 20 μm to about 50 μm, for example. The first and second retardation films SRF1 and SRF2 may have the same thickness or different thicknesses in a thickness range from about 20 μm to about 50 μm, for example. The third adhesive film AF3 may have a thickness of about 10 μm to about 30 μm, for example.

The window WM may be coupled to an uppermost one of the plurality of retardation films SRF1 and SRF2 by the fourth adhesive film AF4. In an exemplary embodiment, the window WM may be coupled to the second retardation film SRF2 through the fourth adhesive film AF4, for example.

The first to fourth adhesive films AF1 to AF4 may include an optically transparent or clear material. In an exemplary embodiment, each of the first to fourth adhesive films AF1 to AF4 may include a pressure sensitive adhesive ("PSA"), an optical clear adhesive ("OCA"), or an optical clear resin ("OCR"), for example. However, the material of the first to fourth adhesive films AF1 to AF4 is not limited thereto.

Referring to FIG. 10, in a display device DD1-2 in an exemplary embodiment of the invention, the second retardation film SRF2 may be disposed on the window WM. In detail, the window WM may be disposed on the first retardation film SRF1, and the second retardation film SRF2 may be disposed on the window WM. The first retardation film SRF1 may be adhered to a bottom surface of the window WM by a third adhesive film AF3, and the second retardation film SRF2 may be adhered to a top surface of the window WM by a fourth adhesive film AF4.

In another exemplary embodiment, the second retardation film SRF2 may be selectively adhered onto the window WM. In this case, two or more retardation films may be disposed between the window WM and the anti-reflection film RPF.

Figure 11:
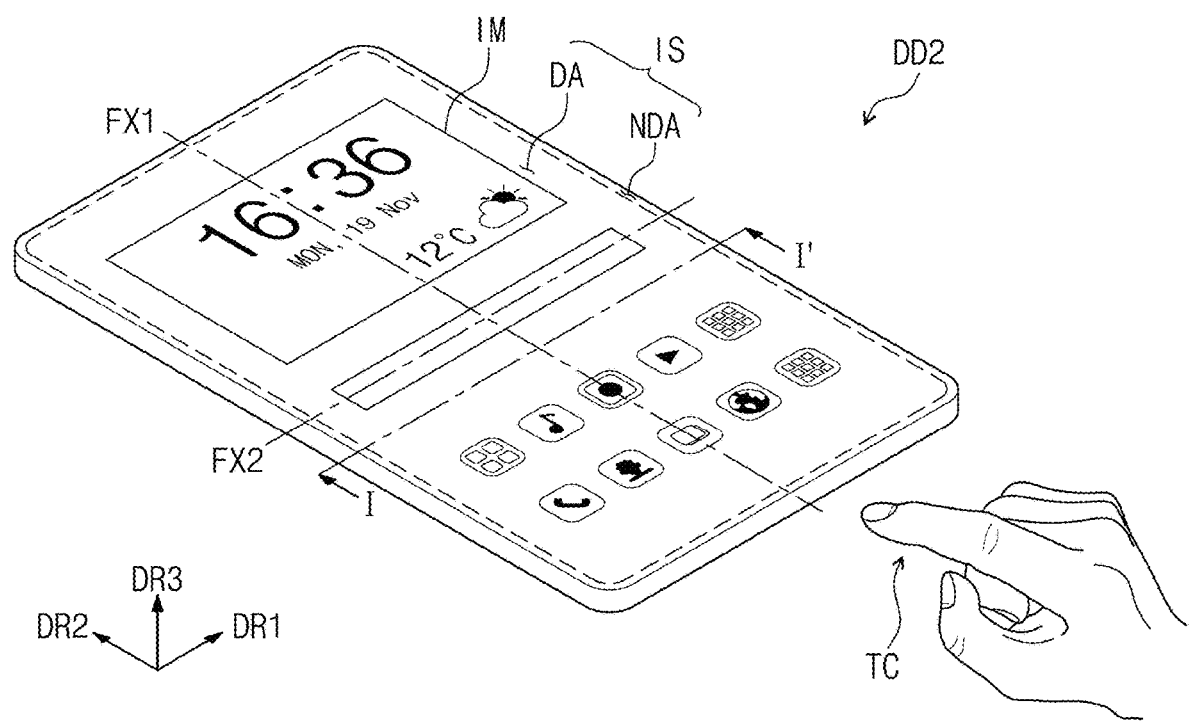
FIG. 11 is a perspective view illustrating another exemplary embodiment of a display device according to the invention.
Figure 12A:
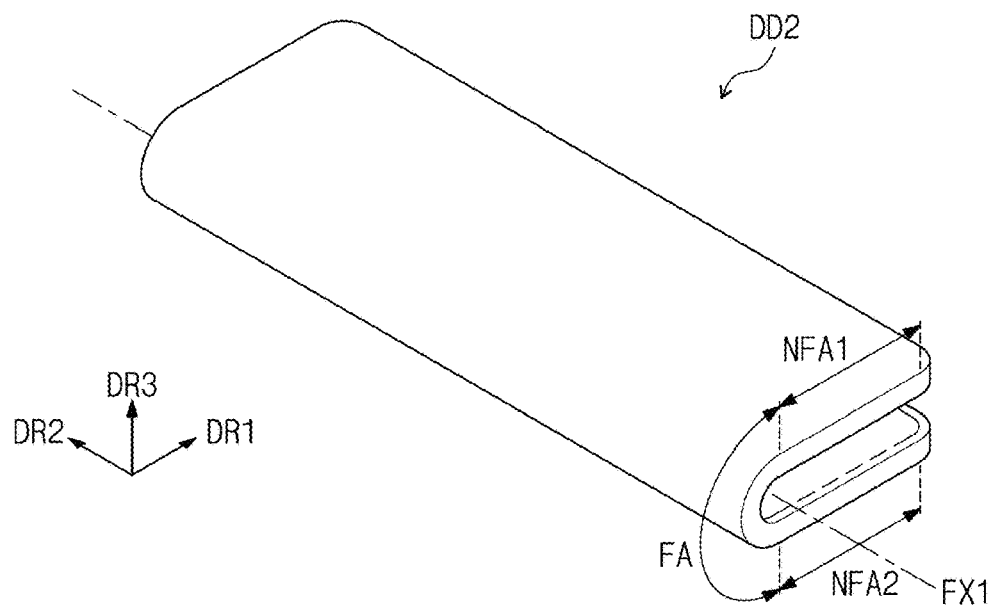
FIG. 12A is a perspective view illustrating a state in which the display device of FIG. 11 is in-folded with reference to a first folding axis.
Figure 12B:
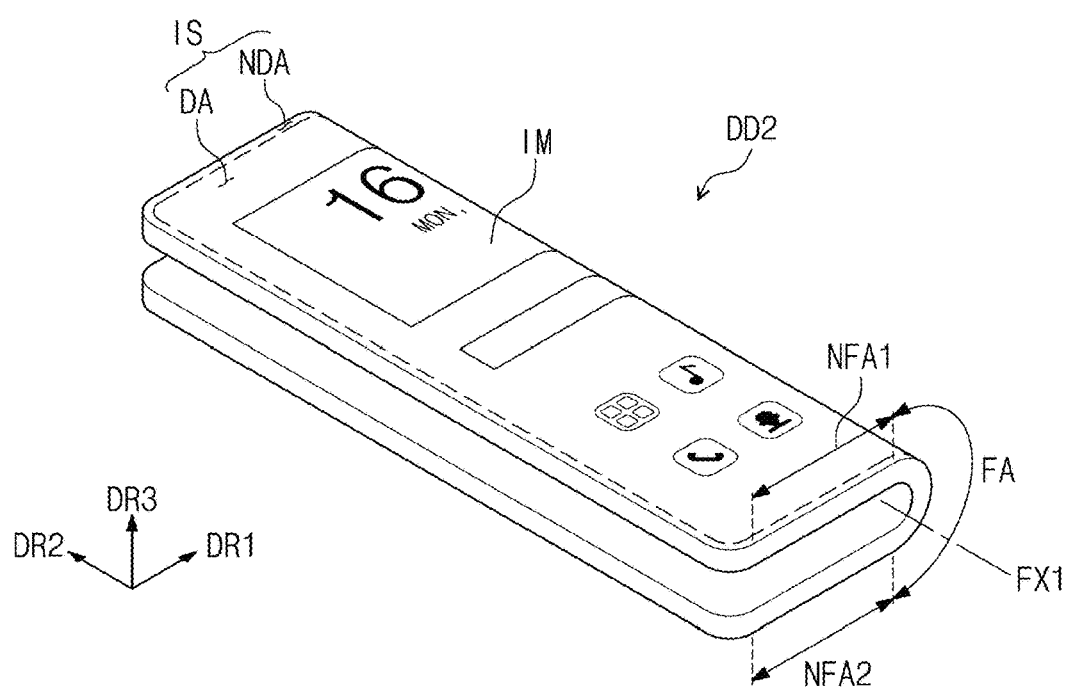
FIG. 12B is a perspective view illustrating a state in which the display device of FIG. 11 is out-folded with reference to the first folding axis.

FIG. 11 is a perspective view illustrating another exemplary embodiment of a display device according to the invention. FIG. 12A is a perspective view illustrating a state in which the display device of FIG. 11 is in-folded about a first folding axis, and FIG. 12B is a perspective view illustrating a state in which the display device of FIG. 11 is out-folded with reference to the first folding axis.

Referring to FIGS. 11 and 12A, a display device DD2 may be a foldable display device. The display device DD2 may be foldable with reference to a folding axis extending in a predetermined direction, for example, a first folding axis FX1 and/or a second folding axis FX2. Hereinafter, a state in which the display device DD2 is folded with reference to the folding axis FX1 or FX2 may be defined as a folding state, and a state in which the display device DD2 is not folded may be defined as a non-folding state.

A plurality of areas may be defined in the display device DD2 in accordance with an operation mode. The plurality of areas may include a folding area FA and at least one or more non-folding areas NFA1 and NFA2. The folding area FA may be defined between two non-folding areas NFA1 and NFA2.

In an exemplary embodiment, the non-folding areas NFA1 and NFA2 may include a first non-folding area NFA1 and a second non-folding area NFA2. The first non-folding area NFA1 may be adjacent to one side of the folding area FA in the first direction DR1, and the second non-folding area NFA2 may be adjacent to another side of the folding area FA in the first direction DR1.

The display device DD2 may be in-folded or out-folded. Here, the term 'in-folding (or in-folded)' may mean that the display device DD2 is folded with reference to the folding axis in such a way that a display surface IS of the first non-folding area NFA1 faces a display surface IS of the second non-folding area NFA2. The term 'out-folding (or out-folded)' may mean that the display device DD2 is folded with reference to the folding axis in such a way that portions of a back surface of the display device DD2 face each other.

The folding area FA may be an area folded based on the first or second folding axis FX1 or FX2 and may be an area substantially forming a curvature. Here, the first folding axis FX1 may extend in the second direction DR2, i.e., a long-axis direction of the display device DD2, and the second folding axis FX2 may extend in the first direction DR1, i.e., a short-axis direction of the display device DD2.

The display device DD2 illustrated in FIG. 12A may be in-folded such that the display surface IS of the first non-folding area NFA1 faces the display surface IS of the second non-folding area NFA2.

Referring to FIG. 12B, the display device DD2 may be out-folded with reference to the first folding axis FX1. When the display device DD2 is out-folded, the display surface IS may be exposed to the outside.

The display device DD2 may perform both the in-folding operation and the out-folding operation. In an alternative exemplary embodiment, the display device DD2 may perform one of the in-folding operation and the out-folding operation.

Figure 13A:
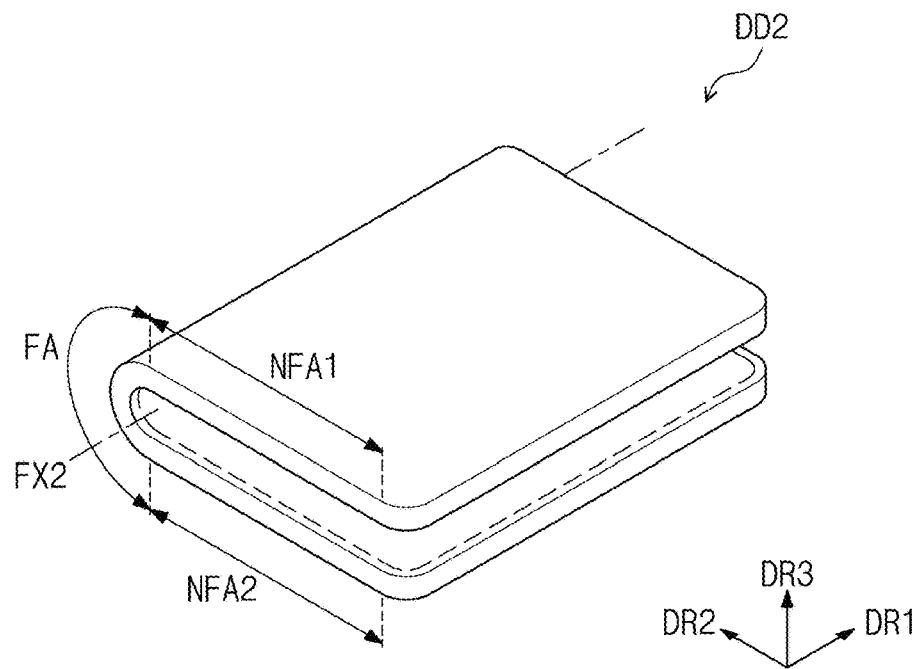
FIG. 13A is a perspective view illustrating a state in which the display device of FIG. 11 is in-folded with reference to a second folding axis.
Figure 13B:
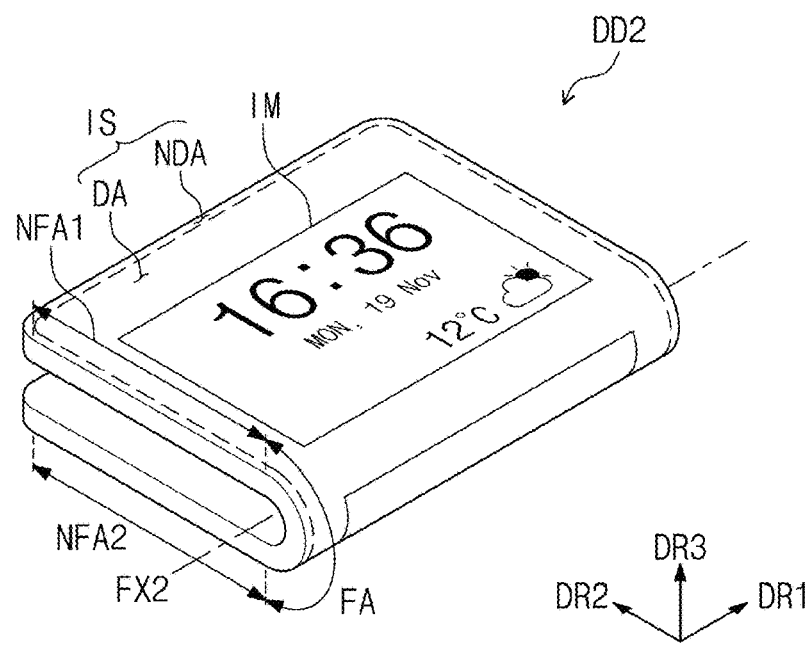
FIG. 13B is a perspective view illustrating a state in which the display device of FIG. 11 is out-folded with reference to the second folding axis.

FIG. 13A is a perspective view illustrating a state in which the display device of FIG. 11 is in-folded with reference to a second folding axis, and FIG. 13B is a perspective view illustrating a state in which the display device of FIG. 11 is out-folded with reference to the second folding axis.

Referring to FIGS. 13A and 13B, the display device DD2 may be in-folded or out-folded with reference to the second folding axis FX2. The second folding axis FX2 may extend in the first direction DR1, i.e., the short-axis direction of the display device DD2.

In an exemplary embodiment, the display device DD2 may have the first and second folding axes FX1 and FX2 and thus may be foldable along the short-axis direction and/or the long-axis direction. In an alternative exemplary embodiment, the display device DD2 may have only one of the first and second folding axes FX1 and FX2.

In the illustrated exemplary embodiment, a single folding area FA is defined in the display device DD2. However, the invention is not limited thereto. In another exemplary embodiment, a plurality of folding areas may be defined in the display device DD2.

Figure 14:
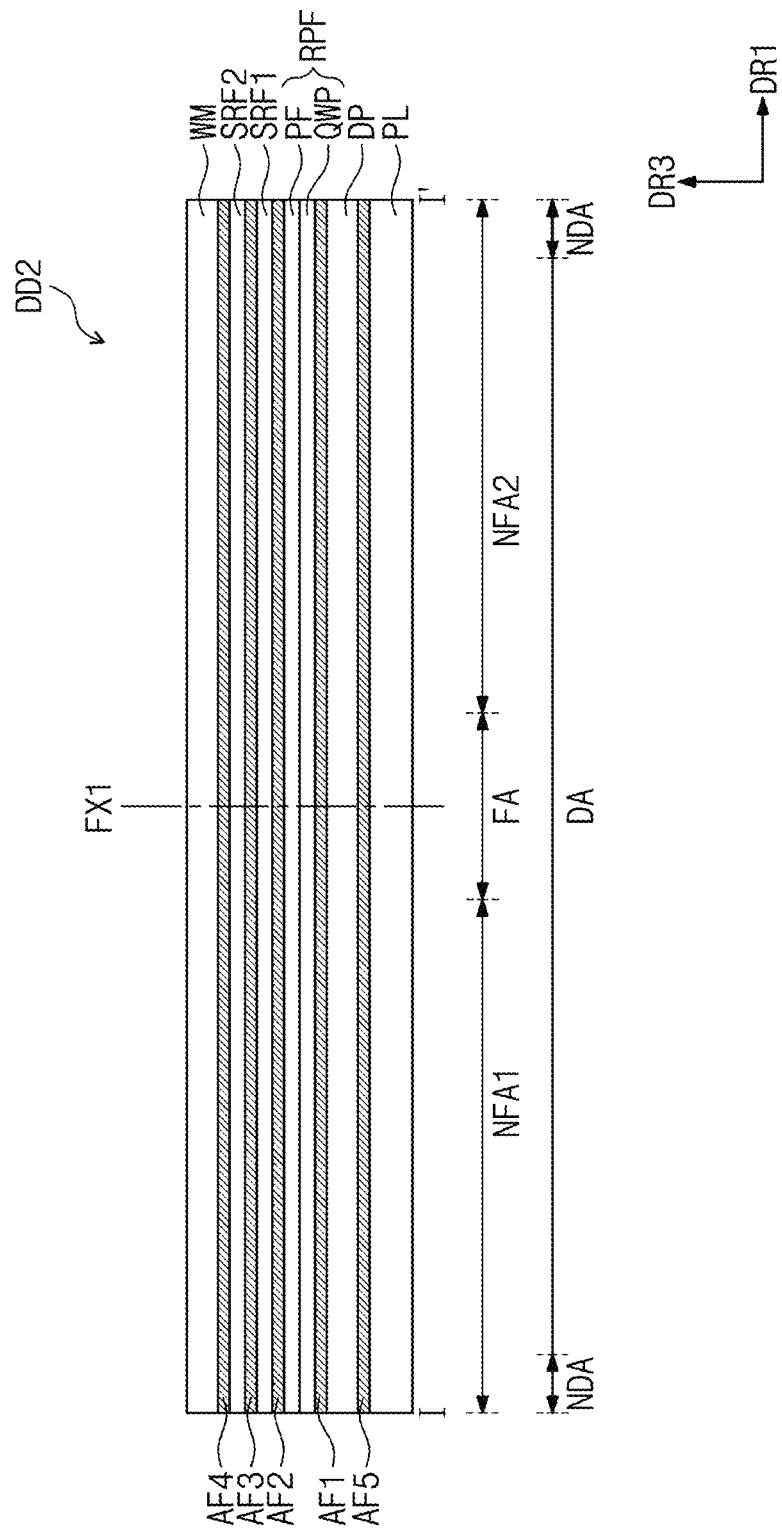
FIG. 14 is a cross-sectional view taken along line I-I' of FIG. 11.

FIG. 14 is a cross-sectional view taken along line I-I' of FIG. 11.

Referring to FIG. 14, the display device DD2 may include the display panel DP for displaying an image, and the window WM disposed on the display panel DP.

The display panel DP may be a flexible display panel. Thus, the display panel DP may be folded with reference to the folding axis FX1 or may be unfolded. In an exemplary embodiment, the display panel DP may be an organic light emitting display panel including an organic light emitting element, for example.

The display device DD2 may further include a protective film PL provided on a back surface of the display panel DP. The protective film PL may absorb an impact applied from the outside to protect the display panel DP from the impact. The protective film PL may include a polymer material. In an exemplary embodiment, the protective film PL may include a plastic film as a base layer. The protective film PL may include the plastic film that includes one including at least one of polyethersulfone ("PES"), polyacrylate, polyetherimide ("PEI"), polyethylenenaphthalate ("PEN"), polyethyleneterephthalate ("PET"), polyphenylene sulfide ("PPS"), polyarylate, polyimide ("PI"), polycarbonate ("PC"), poly(arylene ethersulfone), and any combination thereof, for example.

However, the material of the protective film PL is not limited to the plastic resins. In another exemplary embodiment, the protective film PL may include an organic/inorganic composite material. In an exemplary embodiment, the protective film PL may include a porous organic layer and an inorganic material filling pores of the porous organic layer, for example. In an exemplary embodiment, the protective film PL may include a hydrophilic material.

The protective film PL may be adhered to the back surface of the display panel DP through a fifth adhesive film AF5. The fifth adhesive film AF5 may be optically transparent like the first to fourth adhesive films AF1 to AF4. Each of the first to fifth adhesive films AF1 to AF5 may be an adhesive layer provided by applying and hardening a liquid adhesive material or may be a separately provided adhesive sheet. In an exemplary embodiment, each of the first to fifth adhesive films AF1 to AF5 may include a PSA, an OCA, or an OCR, for example.

In an exemplary embodiment, the display device DD2 may further include an input sensing unit for sensing an external input. The input sensing unit may be disposed on the display panel DP in the form of a panel. In another exemplary embodiment, the input sensing unit may be integrated with the display panel DP through at least one or more continuous processes. In other words, the input sensing unit may be disposed directly on a thin film encapsulation layer (not shown) of the display panel DP. Here, the term 'disposed directly on' may mean that the input sensing unit is disposed on the display panel DP without an additional adhesive member.

An upper protective film may further be disposed between the anti-reflection film RPF and the display panel DP. The upper protective film may include the same material as that of the protective film PL. In another exemplary embodiment, the upper protective film may be provided between the anti-reflection film RPF and the window WM.

The plurality of retardation films SRF1 and SRF2 may be provided on the anti-reflection film RPF. The plurality of retardation films SRF1 and SRF2 may be sequentially stacked in the third direction DR3. Each of the plurality of retardation films SRF1 and SRF2 may change linear polarization of light exiting from the anti-reflection film RPF. In other words, light transmitted through each of the plurality of retardation films SRF1 and SRF2 may be unpolarized light.

Thus, the display device DD2 including the plurality of retardation films SRF1 and SRF2 may output the unpolarized light to improve visibility of a user wearing polarized sunglasses. When the display device DD2 outputs linearly polarized light and a user wearing the polarized sunglasses views an image of the display device DD2, the user may not view the image at a specific angle. However, the display device DD2 may include the plurality of retardation films SRF1 and SRF2 to change the linearly polarized light into the unpolarized light, and thus the visibility of a user wearing the polarized sunglasses may be improved.

Each of the plurality of retardation films SRF1 and SRF2 may have optical anisotropy for changing the linear polarization of light exiting from the anti-reflection film RPF. In addition, each of the plurality of retardation films SRF1 and SRF2 may have a high in-plane retardation, for example, an in-plane retardation of about 1000 nm to about 7000 nm, for example. In an exemplary embodiment of the invention, the plurality of retardation films SRF1 and SRF2 may include the first retardation film SRF1 and the second retardation film SRF2. However, the number of the retardation films is not limited thereto.

In an exemplary embodiment, each of the first and second retardation films SRF1 and SRF2 may have a thickness of about 20 μm to about 50 μm, for example. The first and second retardation films SRF1 and SRF2 may have the same thickness or different thicknesses in a thickness range from about 20 μm to about 50 μm, for example. In addition, the third adhesive film AF3 for coupling the first and second retardation films SRF1 and SRF2 to each other may have a thickness of about 10 μm to about 30 μm, for example.

Figure 15A:
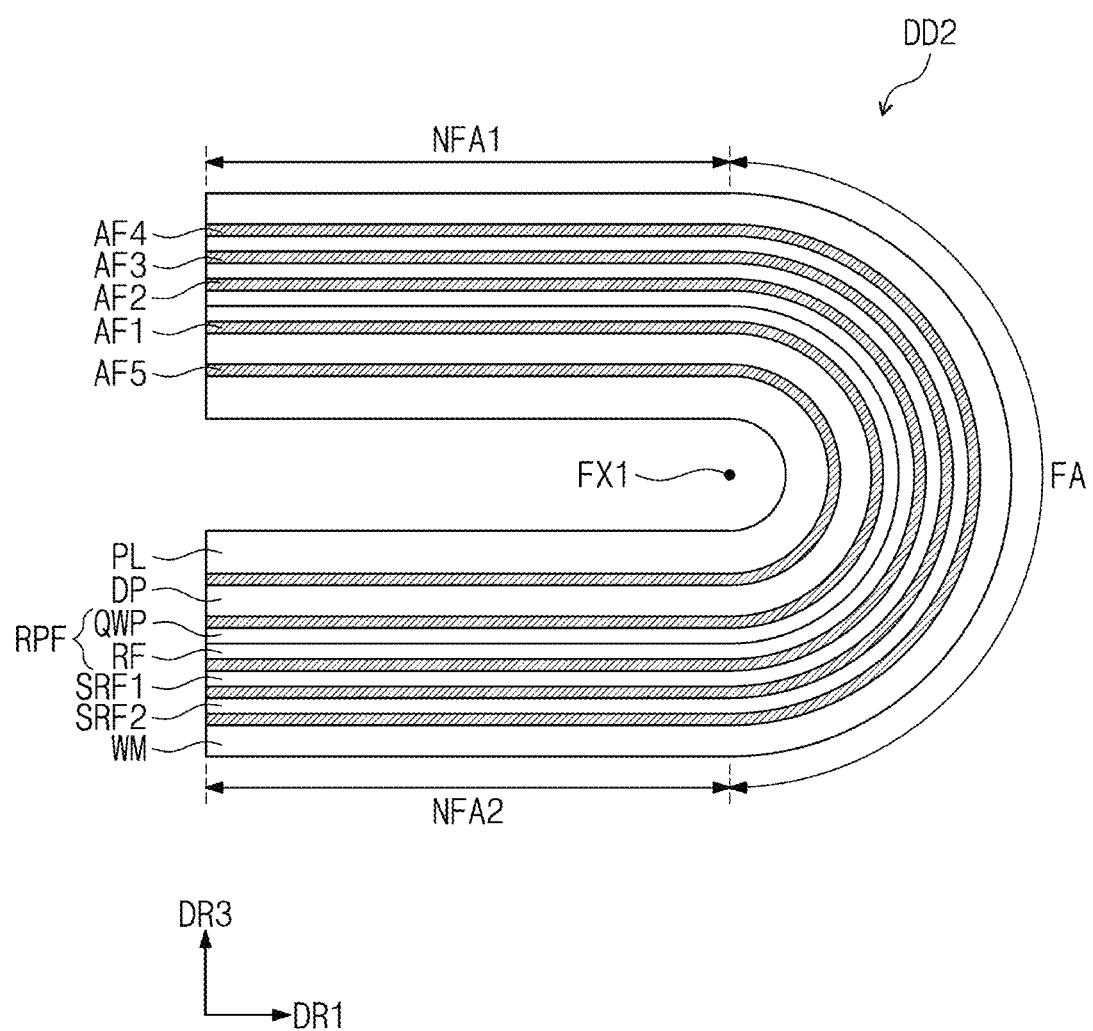
FIG. 15A is a cross-sectional view illustrating a display device in an out-folding state.
Figure 15B:
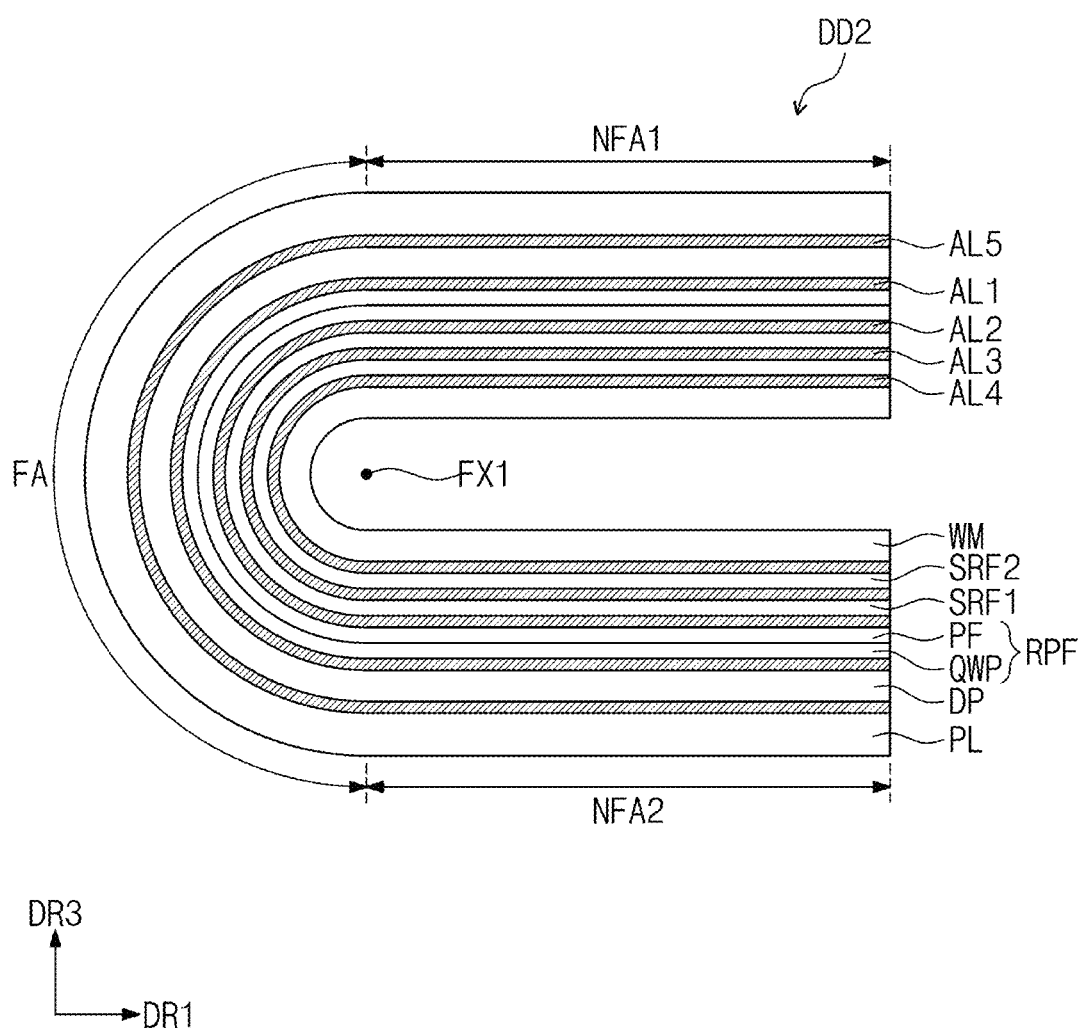
FIG. 15B is a cross-sectional view illustrating a display device in an in-folding state.

FIG. 15A is a cross-sectional view illustrating a display device in an out-folding state, and FIG. 15B is a cross-sectional view illustrating a display device in an in-folding state.

Referring to FIGS. 14 and 15A, the display device DD2 may be folded or unfolded with reference to the first folding axis FX1. The display device DD2 may be out-folded with reference to the first folding axis FX1 by operation of a user. When the display device DD2 is out-folded, a top surface of the window WM may be exposed to the outside.

In the folding state, the first non-folding area NFA1 and the second non-folding area NFA2 may face each other. In an exemplary embodiment, the first non-folding area NFA1 and the second non-folding area NFA2 may face each other in parallel to each other, for example. An area of the folding area FA may not be fixed but may be determined depending on a radius of curvature. The display device DD2 may receive or display an image in the folded state.

Referring to FIGS. 14 and 15B, the display device DD2 may be in-folded with reference to the first folding axis FX1 by operation of a user. When the display device DD2 is in-folded, a portion of the top surface of the window WM which corresponds to the first non-folding area NFA1 may face another portion of the top surface of the window WM which corresponds to the second non-folding area NFA2.

Referring to FIGS. 14, 15A and 15B, the window WM may be located at the outermost side in the out-folding state, and thus a bending stress of the window WM may be relatively small. On the contrary, the window WM may be located at the innermost side in the in-folding state, and thus the bending stress of the window WM may be increased.

The first and second retardation films SRF1 and SRF2 may be provided between the window WM and the anti-reflection film RPF, and thus bending stresses of the first and second retardation films SRF1 and SRF2 in the out-folding state may be less than those of the first and second retardation films SRF1 and SRF2 in the in-folding state.

In addition, the bending stress of each of the first and second retardation films SRF1 and SRF2 may be changed depending on its thickness. The bending stress of each of the first and second retardation films SRF1 and SRF2 may increase as its thickness increases. However, in the exemplary embodiments of the invention, the display device DD2 may include the plurality of retardation films SRF1 and SRF2 having the in-plane retardations of about 1000 nm to about 7000 nm, and the thickness of each of the retardation films SRF1 and SRF2 may range from about 20 μm to about 50 μm, for example. Thus, the thickness of each of the retardation films SRF1 and SRF2 may be reduced.

When the thickness of each of the retardation films is reduced, the bending stress applied to each of the retardation films in the folding operation may be reduced. In an exemplary embodiment, when a tensile rate of each of the retardation films having the thicknesses of about 50 μm is about 3.1 percent (%) in the out-folding operation, a tensile rate of each of the retardation films having the thicknesses of about 25 μm may be reduced to about 2.2% in the out-folding operation, for example.

As described above, the bending stress applied to each retardation film in the foldable display device including the plurality of retardation films having the high in-plane retardations and thin thicknesses may be reduced as compared with a case where a display device includes a single retardation film having a thick thickness and a high in-plane retardation.

Figure 16:
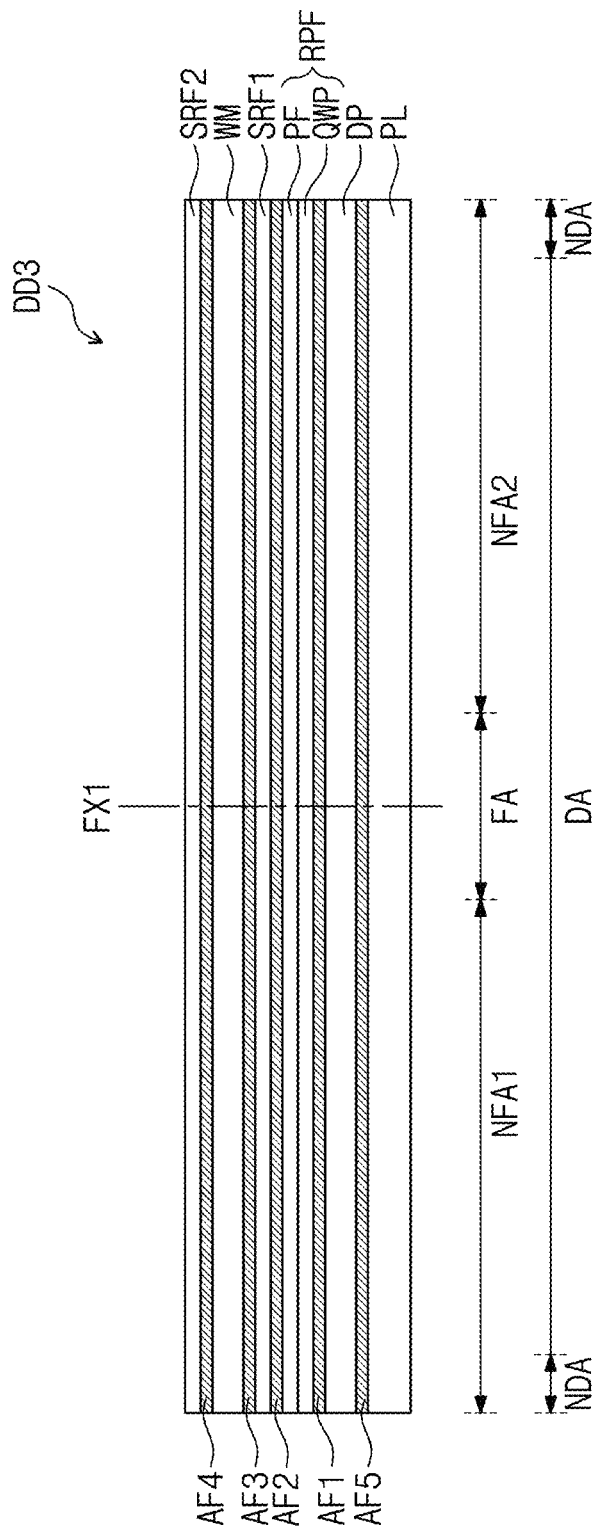
FIG. 16 is a cross-sectional view illustrating another exemplary embodiment of a display device according to the invention.

FIG. 16 is a cross-sectional view illustrating another exemplary embodiment of a display device according to the invention.

Referring to FIG. 16, in a display device DD3 in another exemplary embodiment of the invention, the second retardation film SRF2 may be disposed on the window WM. In detail, the window WM may be disposed on the first retardation film SRF1, and the second retardation film SRF2 may be disposed on the window WM. The first retardation film SRF1 may be adhered to a bottom surface of the window WM by a third adhesive film AF3, and the second retardation film SRF2 may be adhered to a top surface of the window WM by a fourth adhesive film AF4.

In another exemplary embodiment, the second retardation film SRF2 may be selectively adhered onto the window WM. In this case, two or more retardation films may be disposed between the window WM and the anti-reflection film RPF.

In the exemplary embodiments of the invention, the plurality of retardation films, each of which has the in-plane retardation of about 1000 nm to about 7000 nm, may be disposed on the anti-reflection film, and thus the visibility of a user wearing the sunglasses may be improved. In addition, when the plurality of retardation films is disposed, the thickness of each of the retardation films may be reduced. Thus, the bending stress applied to each of the retardation films may be reduced.

While the invention has been described with reference to exemplary embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A display device comprising:
a display panel which displays an image;
an anti-reflection film disposed on a display surface of the display panel; and
a plurality of retardation films disposed on the anti-reflection film,
wherein the plurality of retardation films comprises:
a first retardation film disposed on the anti-reflection film; and
a second retardation film disposed on the first retardation film
wherein the anti-reflection film is disposed between the first retardation film and the display panel and the first retardation film is disposed between the second retardation film and the anti-reflection film,
wherein each of the first and second retardation films has an in-plane retardation of about 1000 nanometers to about 7000 nanometers.

2. The display device of claim 1, wherein an angle difference between a first slow axis of the first retardation film and a second slow axis of the second retardation film is equal to or greater than about 0 degree and less than about 30 degrees.

3. The display device of claim 1, further comprising:
an adhesive film disposed between the first and second retardation films to couple the first and second retardation films to each other.

4. The display device of claim 1, wherein the first and second retardation films have a same in-plane retardation with each other.

5. The display device of claim 1, wherein the first and second retardation films have a same thickness with each other.

6. The display device of claim 1, wherein each of the plurality of retardation films includes a transparent material having optical anisotropy.

7. The display device of claim 6, wherein each of the plurality of retardation films includes one kind of a resin including at least one of a polyester-based resin, a polyolefin-based resin, an acrylic-based resin, a polyurethane-based resin, a polyethersulfone-based resin, a polycarbonate-based resin, a polysulfone-based resin, and a polyether-based resin.

8. The display device of claim 1, wherein the anti-reflection film comprises:
a polarizing film; and
a $\lambda/4$ retardation film disposed between the polarizing film and the display panel.

9. The display device of claim 1, wherein the display panel includes an organic light emitting display panel including an organic light emitting element.

10. The display device of claim 1, further comprising:
a window disposed on the display panel.

11. The display device of claim 10, wherein each of the plurality of retardation films is disposed between the window and the display panel.

12. The display device of claim 10, wherein a first retardation film of the plurality of retardation films is disposed between the window and the display panel, and
wherein a second retardation film of the plurality of retardation films is disposed on the window.

* * * * *